United States Patent
Haverkort et al.

(10) Patent No.: US 7,294,582 B2
(45) Date of Patent: *Nov. 13, 2007

(54) LOW TEMPERATURE SILICON COMPOUND DEPOSITION

(75) Inventors: Ruben Haverkort, Amersfoort (NL); Yuet Mei Wan, Mount Waverley (AU); Marinus J. De Blank, Heverlee (BE); Cornelius A. van der Jeugd, Heverlee (BE); Jacobus Johannes Beulens, Scottsdale, AZ (US); Michael A. Todd, Phoenix, AZ (US); Keith D. Weeks, Gilbert, AZ (US); Christian J. Werkhoven, Tempe, AZ (US); Christophe F. Pomarede, Phoenix, AZ (US)

(73) Assignee: ASM International, N.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/213,449

(22) Filed: Aug. 25, 2005

(65) Prior Publication Data

US 2006/0088985 A1    Apr. 27, 2006

Related U.S. Application Data

(63) Continuation-in-part of application No. 10/623,482, filed on Jul. 18, 2003.

(60) Provisional application No. 60/605,068, filed on Aug. 27, 2004, provisional application No. 60/397,576, filed on Jul. 19, 2002.

(51) Int. Cl.
　　*H01L 21/31*　　(2006.01)
　　*H01L 21/469*　　(2006.01)

(52) U.S. Cl. ............... 438/763; 438/775; 438/786; 438/791; 257/E21.192; 257/E21.267; 257/E21.268; 257/E21.293

(58) Field of Classification Search ........... 438/763, 438/775, 786, 791, 726; 257/E21.192, E21.267, 257/E21.268
See application file for complete search history.

(56) References Cited

U.S. PATENT DOCUMENTS 4,363,828 A　　12/1982　Brodsky et al.
(Continued)

FOREIGN PATENT DOCUMENTS

EP　　0368651 A2　　5/1990
(Continued)

OTHER PUBLICATIONS

Ikoma et al., Growth of Si/3C-SiC/Si(100) hetrostructures by pulsed supersonic free jets, Applied Physics Letters, vol. 75, No. 25, pp. 3977-3979, Dec. 1999.
(Continued)

*Primary Examiner*—Michael Lebentritt
*Assistant Examiner*—Ron Pompey
(74) *Attorney, Agent, or Firm*—Knobbe Martens Olson & Bear LLP

(57) ABSTRACT

Sequential processes are conducted in a batch reaction chamber to form ultra high quality silicon-containing compound layers, e.g., silicon nitride layers, at low temperatures. Under reaction rate limited conditions, a silicon layer is deposited on a substrate using trisilane as the silicon precursor. Trisilane flow is interrupted. A silicon nitride layer is then formed by nitriding the silicon layer with nitrogen radicals, such as by pulsing the plasma power (remote or in situ) on after a trisilane step. The nitrogen radical supply is stopped. Optionally non-activated ammonia is also supplied, continuously or intermittently. If desired, the process is repeated for greater thickness, purging the reactor after each trisilane and silicon compounding step to avoid gas phase reactions, with each cycle producing about 5-7 angstroms of silicon nitride.

44 Claims, 12 Drawing Sheets

U.S. PATENT DOCUMENTS

| | | | |
|---|---|---|---|
| 4,495,218 A | 1/1985 | Azuma et al. |
| 4,585,671 A | 4/1986 | Kitagawa et al. |
| 4,684,542 A | 8/1987 | Jasinski et al. |
| 4,720,395 A | 1/1988 | Foster |
| 5,214,002 A | 5/1993 | Hayashi et al. |
| 5,227,329 A | 7/1993 | Kobayashi et al. |
| 5,356,673 A | 10/1994 | Schmitt et al. |
| 5,356,821 A | 10/1994 | Naruse et al. |
| 5,389,398 A | 2/1995 | Suzuki et al. |
| 5,389,570 A | 2/1995 | Shiozawa |
| 5,453,858 A | 9/1995 | Yamazaki |
| 5,471,330 A | 11/1995 | Sarma |
| 5,591,494 A | 1/1997 | Sato et al. |
| 5,607,724 A | 3/1997 | Beinglass et al. |
| 5,614,257 A | 3/1997 | Beinglass et al. |
| 5,648,293 A | 7/1997 | Hayama et al. |
| 5,656,531 A | 8/1997 | Thakur et al. |
| 5,695,819 A | 12/1997 | Beinglass et al. |
| 5,698,771 A | 12/1997 | Shields et al. |
| 5,700,520 A | 12/1997 | Beinglass et al. |
| 5,786,027 A | 7/1998 | Rolfson |
| 5,789,030 A | 8/1998 | Rolfson |
| 5,837,580 A | 11/1998 | Thakur et al. |
| 5,849,601 A | 12/1998 | Yamazaki |
| 5,874,129 A | 2/1999 | Beinglass et al. |
| 5,876,797 A | 3/1999 | Beinglass et al. |
| 5,885,869 A | 3/1999 | Turner et al. |
| 5,959,326 A | 9/1999 | Aiso et al. |
| 6,027,705 A | 2/2000 | Kitsuno et al. |
| 6,083,810 A | 7/2000 | Obeng et al. |
| 6,103,600 A | 8/2000 | Ueda et al. |
| 6,159,828 A | 12/2000 | Ping et al. |
| 6,161,498 A | 12/2000 | Toraguchi et al. |
| 6,171,662 B1 | 1/2001 | Nakao |
| 6,197,669 B1 | 3/2001 | Twu et al. |
| 6,197,694 B1 | 3/2001 | Beinglass |
| 6,228,181 B1 | 5/2001 | Yamamoto et al. |
| 6,326,311 B1 | 12/2001 | Ueda et al. |
| 6,385,020 B1 | 5/2002 | Shin et al. |
| 6,455,892 B1 | 9/2002 | Okuno et al. |
| 6,503,846 B1 * | 1/2003 | Niimi et al. ............... 438/776 |
| 6,551,893 B1 * | 4/2003 | Zheng et al. ............... 438/387 |
| 6,613,695 B2 | 9/2003 | Pomarede et al. |
| 6,821,825 B2 | 11/2004 | Todd et al. |
| 6,962,859 B2 | 11/2005 | Todd et al. |
| 7,125,582 B2 | 10/2006 | McSwiney et al. |
| 7,172,792 B2 | 2/2007 | Wang et al. |
| 7,192,626 B2 | 3/2007 | Dussarrat et al. |
| 2001/0032986 A1 | 10/2001 | Miyasaka |
| 2002/0098627 A1 | 7/2002 | Pomarede et al. |
| 2003/0059535 A1 * | 3/2003 | Luo et al. ............... 427/255.28 |
| 2004/0096582 A1 | 5/2004 | Wang et al. |
| 2005/0079692 A1 | 4/2005 | Samoilov et al. |
| 2005/0080286 A1 | 4/2005 | Wang et al. |
| 2005/0118837 A1 | 6/2005 | Todd et al. |
| 2006/0084283 A1 | 4/2006 | Paranjpe et al. |

FOREIGN PATENT DOCUMENTS

| | | |
|---|---|---|
| EP | 0486047 A2 | 5/1992 |
| EP | 0747974 A2 | 12/1996 |
| EP | 1065728 A2 | 1/2001 |
| GB | 2 298 313 A | 8/1996 |
| GB | 2332564 A | 6/1999 |
| JP | 59078919 A | 1/1982 |
| JP | 57209810 A | 12/1982 |
| JP | 59078918 A | 5/1984 |
| JP | 60043485 A | 3/1985 |
| JP | S60-43485 | 3/1985 |
| JP | 61153277 A | 7/1986 |
| JP | 62076612 A | 4/1987 |
| JP | 63003414 A | 1/1988 |
| JP | 63003463 A | 1/1988 |
| JP | 01217956 A | 8/1989 |
| JP | 01268064 A | 10/1989 |
| JP | 02155225 A | 6/1990 |
| JP | H 02-155225 | 6/1990 |
| JP | 03091239 A | 4/1991 |
| JP | H3-91239 | 4/1991 |
| JP | 03185817 A | 8/1991 |
| JP | 03187215 A | 8/1991 |
| JP | H3-185817 | 8/1991 |
| JP | H3-187215 | 8/1991 |
| JP | 03292741 A | 12/1991 |
| JP | 04323834 A | 11/1992 |
| JP | 05021378 A | 1/1993 |
| JP | 05062911 A | 3/1993 |
| JP | H5-62911 | 3/1993 |
| JP | 07249618 A | 9/1995 |
| JP | 08242006 A | 9/1996 |
| JP | 11317530 | 11/1999 |
| WO | WO 02/064853 A2 | 8/2002 |
| WO | WO 2004/009861 A2 | 1/2004 |

OTHER PUBLICATIONS

Olivares, J. et al., "Solid-phase crystallization of amorphous SiGe films deposed by LPCVD on SiOs and glass," Thin Solid Films 337 (1999), pp. 51-54.

International Search Report dated Nov. 13, 2003 for international patent application No. PCTUS02/02921, filed on Feb. 1, 2002.

International Search Report and Written Opinion for International Application No. PCT/US2006/047805. May 8, 2007.

Ishihara et al., "Low-temperature chemical-vapor-deposition of silicon-nitride from tetra-silane and hydrogen azide," *Materials Research Society Symposium Proceedings*, vol. 284, pp. 3-8 (1983).

Yeh et al., "Low-temperature chemical-vapor-deposition of silicon-nitride film from hexachloro-disilane and hydrazine," *Jpn. J. Appl. Phys.* vol. 35, part 1, No. 2B, pp. 1509-1512 (Feb. 1996).

* cited by examiner

US 7,294,582 B2

LOW TEMPERATURE SILICON COMPOUND DEPOSITION

REFERENCE TO RELATED APPLICATIONS

This application claims the priority benefit of U.S. Provisional Application Ser. No. 60/605,068, BATCH SYSTEMS FOR LOW TEMPERATURE SILICON COMPOUND DEPOSITION, filed Aug. 27, 2004. This application is also a continuation-in-part of U.S. patent application Ser. No. 10/623,482, filed Jul. 18, 2003, which claims the priority benefit of U.S. Provisional Application Ser. No. 60/397,576, METHOD TO FORM ULTRA HIGH QUALITY SILICON-CONTAINING LAYERS, filed Jul. 19, 2002.

In addition, this application is related to: U.S. patent application Ser. No. 10/074,564, THIN FILMS AND METHODS OF MAKING THEM, filed Feb. 11, 2002; U.S. patent application Ser. No. 10/074,563, IMPROVED PROCESS FOR DEPOSITION OF SEMICONDUCTOR FILMS, filed Feb. 11, 2002; U.S. Provisional Application Ser. No. 60/659,454, HIGH STRESS NITRIDE AND METHOD FOR FORMATION THEREOF, filed Mar. 7, 2005; and U.S. patent application Ser. No. 11/212,503, REMOTE PLASMA ACTIVATED NITRIDATION, filed Aug. 24, 2005, all of which are hereby incorporated by reference in their entireties.

FIELD OF THE INVENTION

This invention relates generally to forming silicon-containing layers during integrated circuit fabrication and, more particularly, to methods for forming uniform silicon compound layers by reaction rate limited processing.

BACKGROUND OF THE INVENTION

As the dimensions of microelectronic devices become smaller, the physical characteristics of the deposited layers, including uniformity in thickness, composition, and coverage, become more important. This is particularly true of the layers, or films, of silicon compounds that can act as dielectrics or insulators to separate conductive elements of an integrated circuit. For example, silicon nitride materials are widely used in the semiconductor industry as transistor gate dielectrics, insulators between metal levels, barriers to prevent oxidation and other diffusion, hard masks, passivation layers, spacer materials in transistors, anti-reflective coating materials, layers in non-volatile memories, etc. Silicon oxide and silicon carbide materials are similarly common in integrated circuit fabrication.

Currently, chemical vapor deposition (CVD) is the most commonly used process for deposition of thin layers on a substrate. With this process, precursors for molecules or atoms that will ultimately form the deposited layer are fed simultaneously into a reaction chamber as molecular precursors. The substrate is kept at a temperature that is optimized to promote chemical reaction between the molecular precursors so that a layer of the desired atomic or molecular species is deposited on the substrate. The most common molecular precursor for forming silicon-containing thin layers by conventional CVD has been silane.

CVD has proven to have a superior ability to deposit layers with relatively uniform thicknesses. In addition, it produces relatively conformal layers, i.e., layers that closely replicate the shape of the surface on which they are being deposited. However, as device density continues to increase and geometries continue to become more complicated, deposition processes have been further refined to meet the need for even more uniform and conformal layers.

For these reasons, atomic layer deposition (ALD) has become more prominent in semiconductor fabrication. ALD typically involves multiple deposition cycles, with each cycle depositing a thin layer. ALD seeks to deposit perfectly conformal and uniform layers by depositing no more than a single monolayer during each cycle. Typically, this is accomplished by use of a self-terminating precursor molecule and optimizing conditions to avoid condensation and thermal decomposition of the precursors. For example, to deposit a layer of a titanium compound, a titanium precursor molecule such as $TiCl_4$ can be used. With $TiCl_4$, the titanium atom attaches to the surface of the substrate while chlorine atoms terminate the adsorbed layer on the side of the titanium atom opposite the substrate surface. As a result, once the substrate surface is covered with a monolayer of the titanium molecule, the top of the titanium layer will comprise chlorine atoms which are relatively inert and cause the adsorption process to self-terminate.

In contrast to CVD, ALD molecular precursors used to produce a compound layer, i.e., a layer comprising two or more elements, are typically introduced into the ALD reactor in separate pulses. For example, a first precursor self-limitingly adsorbs on the substrate in a first pulse, with ligands of the adsorbed species preventing further adsorption. Between introduction of precursors, the reaction chamber is evacuated or purged with inert gas to prevent gas phase reactions between the different precursors. After purging of the first precursor, a second precursor can be introduced into the reaction chamber to react with the layer deposited by introduction of the first precursor, e.g., to strip the ligands or to replace the ligands. In this way, one cycle is completed and one thin compound layer is deposited on a substrate. After the layer is reacted with the second precursor, the second precursor (and any byproduct) can be removed by evacuation or inert gas purging. In addition to these precursors, other reactants can also be pulsed into the reaction chamber during each cycle. The cycle can then be repeated until a compound layer of a desired thickness is reached.

While ALD gives superior conformality and uniformity in comparison to CVD, ALD is relatively inefficient in terms of speed. Because a layer of a desired thickness must, in theory, be formed one molecular monolayer at a time (in actuality, less than one molecular monolayer is typical, due to the blocking of reactive sites as a result of steric hindrance), and because multiple steps must be employed to form each monolayer, ALD forms a layer with a given thickness more slowly than does CVD. Consequently, while conformality and uniformity is increased, ALD has the drawback of having decreased throughput in comparison to CVD.

Nevertheless, high conformality and uniformity are important considerations as semiconductor fabrication currently involves depositing silicon-containing compound films during the process of making thousands or even millions of devices simultaneously on a substrate that is 200 millimeters (mm) in diameter. Moreover, the industry is transitioning to 300 mm wafers, and could use even larger wafers in the future. In addition, even larger substrates, in the form of flat panel displays, etc., are becoming increasingly common. Significant variations in the thickness and/or composition of the silicon-containing compound films during the manufacturing process can lead to lower manufacturing yields when the affected devices do not meet required performance specifications. Also, variations across the film within a particular device can reduce device performance and/or reliability. Thus, as substrate sizes increase to accommodate manufacture of larger numbers of microelectronic devices on a circuit, the problems created by the shortcomings of conventional CVD processes also increase.

Consequently, due to the constant need for high throughput, the decreasing sizes of circuits in microelectronic devices and the increasing surface areas of substrates, there is a continuing need for methods for forming more uniform and conformal layers of silicon compounds, while also allowing for high throughput.

SUMMARY OF THE INVENTION

In accordance with one aspect of the invention, a method is provided for fabricating integrated circuits. The method comprises depositing a silicon layer on a plurality of substrates in a batch process chamber by exposing the substrates to a supply of trisilane. The supply of trisilane is interrupted. A silicon compound layer is formed by exposing the silicon layer to a reactive species after interrupting the supply of trisilane.

In accordance with yet another aspect of the invention, a method of semiconductor processing is provided. The method comprises establishing reaction rate limited deposition conditions in a reaction chamber. A silicon layer is deposited on each of a plurality of substrates in the reaction chamber by exposing the substrates to a silicon source. The silicon layer has a thickness between about 3 Å and about 30 Å. The silicon source is a polysilane. The flow of the silicon source is interrupted and the silicon source is removed from the reaction chamber. The silicon layer is exposed to radicals to form a silicon compound layer.

In another aspect of the invention, a semiconductor reactor is provided. The reactor comprises a process chamber and an evacuated tube inside the process chamber. The tube is formed by an insulating sleeve, which houses a coil of conductive material connected to a power source. The tube is configured to produce a plasma outside the sleeve but inside the process chamber.

BRIEF DESCRIPTION OF THE DRAWINGS

The invention will be better understood from the detailed description of the preferred embodiments and from the appended drawings, which are meant to illustrate and not to limit the invention and wherein like numerals refer to like parts throughout.

DETAILED DESCRIPTION OF THE PREFERRED EMBODIMENTS

Figure 1:
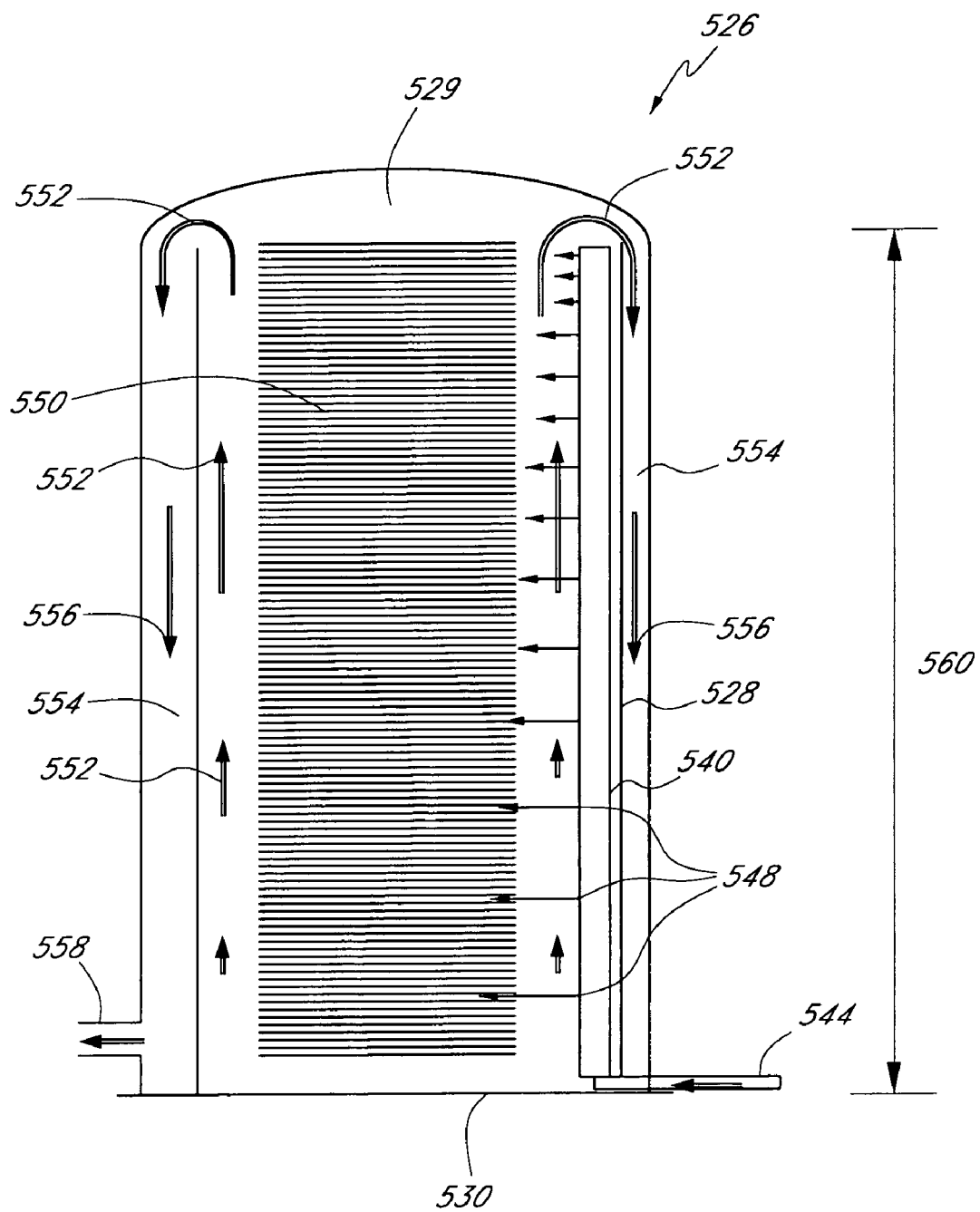
FIG. 1 is a schematic cross-sectional side view of an elongated batch process tube with a gas injector, constructed in accordance with preferred embodiments of the invention.

International patent publication No. WO 04009861 A2, to Todd et al., which claims priority to the above-incorporated U.S. patent application Ser. No. 10/623,482, filed Jul. 16, 2002, discloses one method of depositing silicon nitride to form highly uniform and conformal films. Todd et al. teaches trisilane and nitrogen source pulses that are alternated with intervening purge steps. Todd et al., however, emphasizes the importance of the mass flow limited regime for such deposition.

It will be appreciated that high quality results in the mass flow limited regime is more easily achieved in the context of single substrate reactors than in batch systems. Batch systems, while advantageously allowing for increased throughput by simultaneously processing a plurality of substrates, can encounter difficulties in achieving an even distribution of precursor vapors across all substrates within the reaction chamber. Because the local deposition rate in a mass flow limited regime is dependent upon the local concentration of precursor, an uneven distribution of precursors can result in an uneven deposition rate across a substrate or across a batch of substrates. In turn, the uneven deposition rate can result in non-uniform layers. On the other hand, batch systems can often employ principles of hot wall reactors to achieve highly uniform temperature distributions. Accordingly, rather than the mass transport limited regime, depositions according to the preferred embodiments are preferably conducted under reaction rate limited conditions, also known as the kinetically limited reaction regime or kinetic regime, wherein deposition rates are sensitive to temperature changes but relatively insensitive to supplied reactant concentrations.

Depositions according to the preferred embodiments allow for the formation of highly uniform and conformal silicon-containing compound layers, particularly for batch processing. A silicon precursor is flowed into a batch process chamber to deposit a silicon layer. The silicon precursor is then removed from the chamber, e.g., by evacuation or by purging with another gas, such as a purge gas. Another precursor is flowed into the chamber to react with the silicon layer, thereby forming a silicon compound layer. The other precursor is then removed from the chamber. This sequence of flowing and removing precursors from the chamber can be repeated as desired to form a silicon-containing compound layer of a desired thickness. Deposition conditions are preferably chosen such that the formation of the silicon-containing compound layer occurs in the kinetic regime.

Preferably, the silicon precursor is a silane, more preferably, a polysilane (a silane having the chemical formula $Si_nH_{2n+2}$, where n=2 to 4) and, most preferably, the polysilane is trisilane. To form silicon nitride, the other precursor is a nitrogen species, e.g., an excited nitrogen species, including nitrogen radicals. The excited nitrogen species can be generated by a remote or in situ plasma. In some preferred embodiments, the flow of excited nitrogen species is intermixed with a flow of ammonia. In other preferred embodiments, the flow of ammonia is intermixed with a flow of an excited species which is not a nitrogen species. Unexpectedly, combining ammonia with an excited species has been found to advantageously increase the quality, especially the uniformity, of deposited films.

Thus, depositions according to the preferred embodiments advantageously allow for the formation of very uniform and conformal films, as discussed further below.

Reference will now be made to the Figures, wherein like numerals refer to like parts throughout.

Preferred Batch Reactor

FIGS. 1-6 illustrate two different versions of an exemplary batch reactor, commercially available under the trade name Advance 412™ or A412™ from ASM International N.V. of Bilthoven, The Netherlands. The illustrated reactor is a vertical furnace type of reactor, which has benefits for efficient heating and loading sequences, but the skilled artisan will appreciate that the principles and advantages disclosed herein will have application to other types of reactors.

With reference to FIG. 1, a schematic cross-sectional side-view is shown of an exemplary elongated furnace with a gas injector. The process tube or chamber 526 is preferably surrounded by a heating element (not shown). A liner 528, delimiting the outer perimeter of the reaction space 529, is preferably provided inside the process chamber 526. Preferably, at the bottom of the process chamber 526, a wafer load 550 may enter and exit the process chamber 526 by a door 530. Precursor source gas is injected through a gas injector 540, preferably via a gas feed conduit 544. The gas injector 540 is provided with a pattern of holes 548, preferably extending substantially over the height of the wafer load 550. Note that, because gases are first introduced into the reaction space 529 from the holes 548 of the gas injector 540, the interior of gas delivery devices, such as the gas injector 540, through which gases travel is not part of the reaction space 529 and is, in a sense, outside of the reaction space 529. Consequently, the reaction space 529 comprises the interior volume of the process chamber 526, excluding the volume occupied by gas delivery devices such as the gas injector 540.

In a preferred embodiment, inside the process chamber 526, gas is flowed in a generally upward direction 552 and then removed from the reaction space 529 via an exhaust space 554 between the process chamber 526 and the liner 528, where gas flows in a downward direction 556 to the exhaust 558, which is connected to a pump (not shown). The gas injector 540 preferably distributes process gases inside the process chamber 526 over the entire height of the reaction space 529. The gas injector 540 itself acts as a restriction on the flow of gas, such that the holes 548 that are closer to the conduit 544 tend to inject more gas into the reaction space than those holes 548 that are farther from the conduit 544. Preferably, this tendency for differences in gas flows through the holes 548 can be compensated to an extent by reducing the distance between the holes 548 (i.e., increasing the density of the holes 548) as they are located farther away from the conduit 544. In other embodiments, the size of individual holes making up the holes 548 can increase with increasing distance from the conduit 544, or both the size of the holes 548 can increase and also the distance between the holes 48 can decrease with increasing distance from the conduit 544. Advantageously, however, the preferred embodiments are illustrated with holes 548 of constant size so as to minimize the surface area of the sides of the gas injector 540 containing the holes 548.

The injector 540 is advantageously designed to reduce the pressure inside the gas injector, resulting in a reduction of the gas phase reactions within the injector, since reaction rates typically increase with increasing pressure. While such reduced pressure can also lead to a poor distribution of gas over the height of the gas injector 540, the distribution of holes 548 across the height of the injector 540 is selected to improve uniformity of gas distribution.

Figure 2:
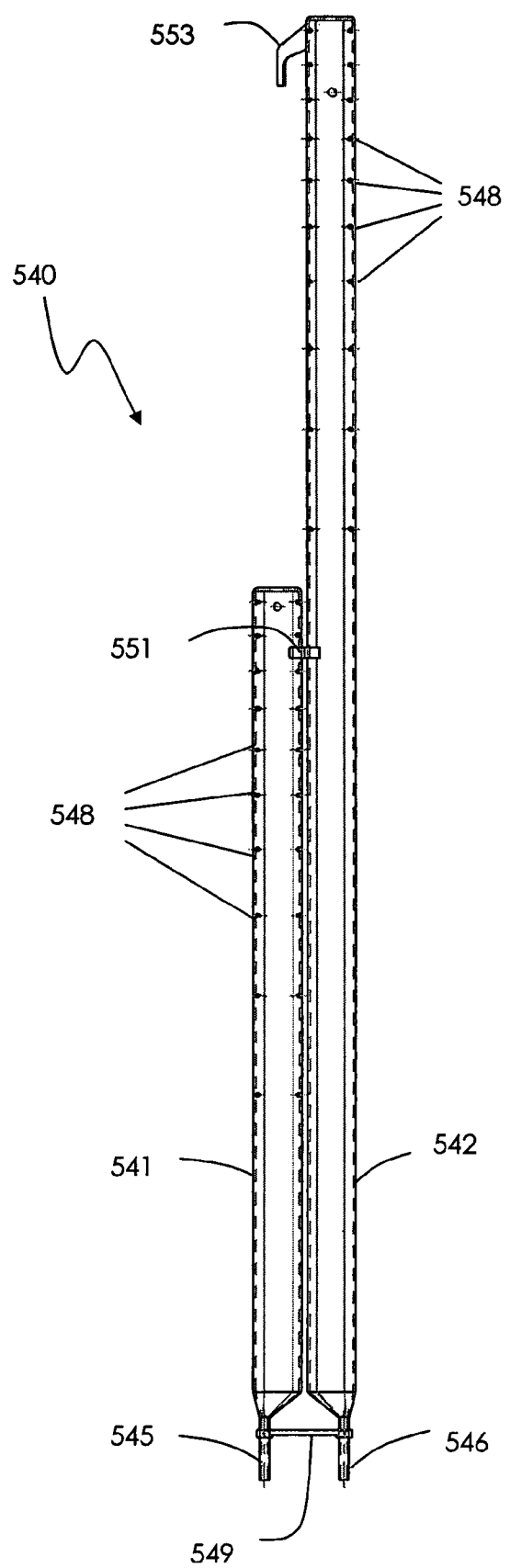
FIG. 2 is a front view of a gas injector for use with the batch process tube of FIG. 1.

The gas injector 540 in accordance with one illustrative embodiment of the invention is shown in FIG. 2. The gas injector 540 preferably comprises two gas injector parts 541 and 542, each preferably provided with separate gas feed conduit connections 545 and 546, respectively. The first part 541 injects gas into the lower volume of the reaction space 529 (FIG. 1) and the second part 542 injects gas into the upper volume of the reaction space 529 (FIG. 1). The parts 541 and 542 are connected by linkages 549 and 551. At its top end, the gas injector 540 can be provided with a hook 553, to secure the top end of the gas injector 540 to a hook support inside the chamber 526 (FIG. 1).

The gas injector 540 is provided with a pattern of holes 548 substantially extending over the height 560 (FIG. 1) of the wafer load 550 (FIG. 1). The total cross section of the holes is preferably at least about 30 mm². The diameter of each of holes 548 is preferably about 1 mm or more, more preferably between about 2.5 mm and 3.5 mm, and most preferably about 3 mm. In the illustrative embodiment shown in FIG. 2, the gas injector 540 has 40 holes total for a total hole cross-sectional area of about 282 mm². More generally, the total cross-sectional area of the holes 548 is preferably about 30 mm² or more, and more preferably between about 196 mm² and 385 mm².

Figure 3:
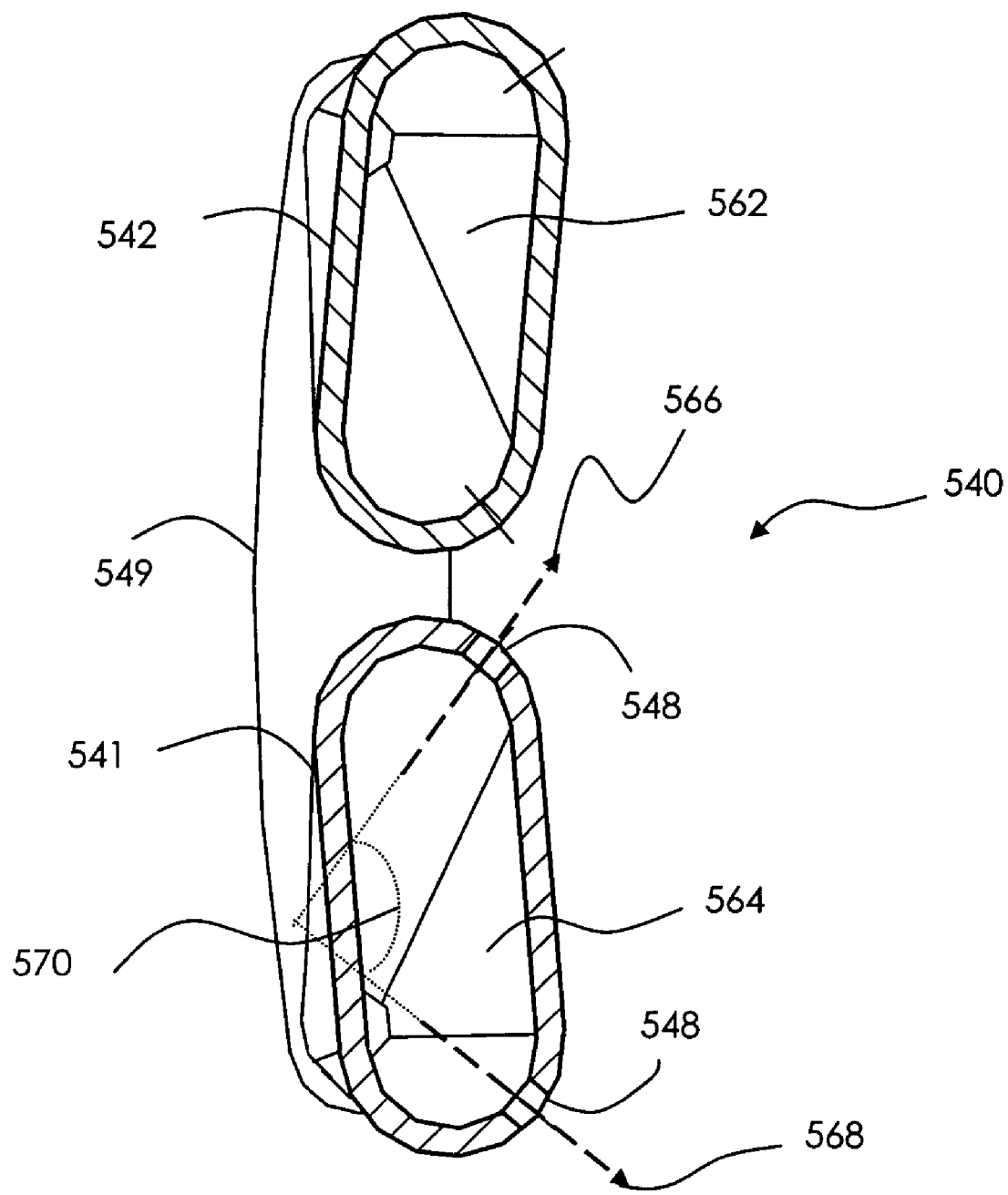
FIG. 3 is a horizontal cross-sectional view of the gas injector of FIG. 2.

With reference to FIG. 3, each part 541 and 542 of the gas injector 540 has an inner cross-sectional area 564 and 562, respectively, available for the conduction of source gases through the gas injector 540. Preferably, each of inner cross-sectional areas 564 and 562 are at least about 100 mm². In the illustrative embodiment, the cross-sectional area of each of the parts 541, 542 of the gas injector 540 is about 330 mm². More generally, the cross-sectional area of each of the parts 541, 542 is between about 140 mm² and 600 mm², more preferably between about 225 mm² and 455 mm².

The cross-section shown in FIG. 3 is taken through the lower end of the gas injector 540 and straight through a pair of injection holes 548 provided in gas injector part 541, for injecting the gas into the lower end of the process chamber 526. Preferably, in each gas injector part, the holes 548 are provided in pairs, at the same height. In addition, the two holes 548 preferably inject the precursor gas in two directions 566 and 568 forming an angle 570 of between about 60 and 120 degrees, illustrated at about 90 degrees, to improve the radial uniformity. Moreover, as shown, the tubes comprising the gas injector 540 preferably have an oblong shape, as viewed in horizontal cross-section. Preferably, the longer dimension of the oblong shape faces the center of the process chamber 526, i.e., the side of the oblong shape with the longer dimension is perpendicular to an imaginary line extending radially from the center of the process chamber 526.

In a preferred embodiment, in a CVD mode, two precursor source gases, providing the two constituting elements of a binary film, are mixed in the gas supply system (not shown) prior to entering the gas injector 540 via feed conduit connections 545 and 546 (FIG. 2). Pre-mixing the precursor gases in the gas supply system is one way to ensure a homogeneous composition of injected gas over the height of the boat. However, the gases can be flowed into the process chamber 526 (FIG. 1) without pre-mixing. In another embodiment, the two precursor source gases can each be injected via their own separate gas injectors 540 (not shown), so that they are first mixed after being injected into the reaction space 529. Consequently, it will be appreciated that more than one gas injector 540 may be located inside the process chamber 526.

Advantageously, the use of two gas injector parts 541 and 542 allows for further tuning possibilities. The flows supplied to the different gas injector parts 541, 542 can be chosen differently to fine-tune the gas flow into the reaction space 529. This will improve uniformity in the deposition rates of precursors over the height 560 of the wafer load 550 (FIG. 1).

Figure 4:
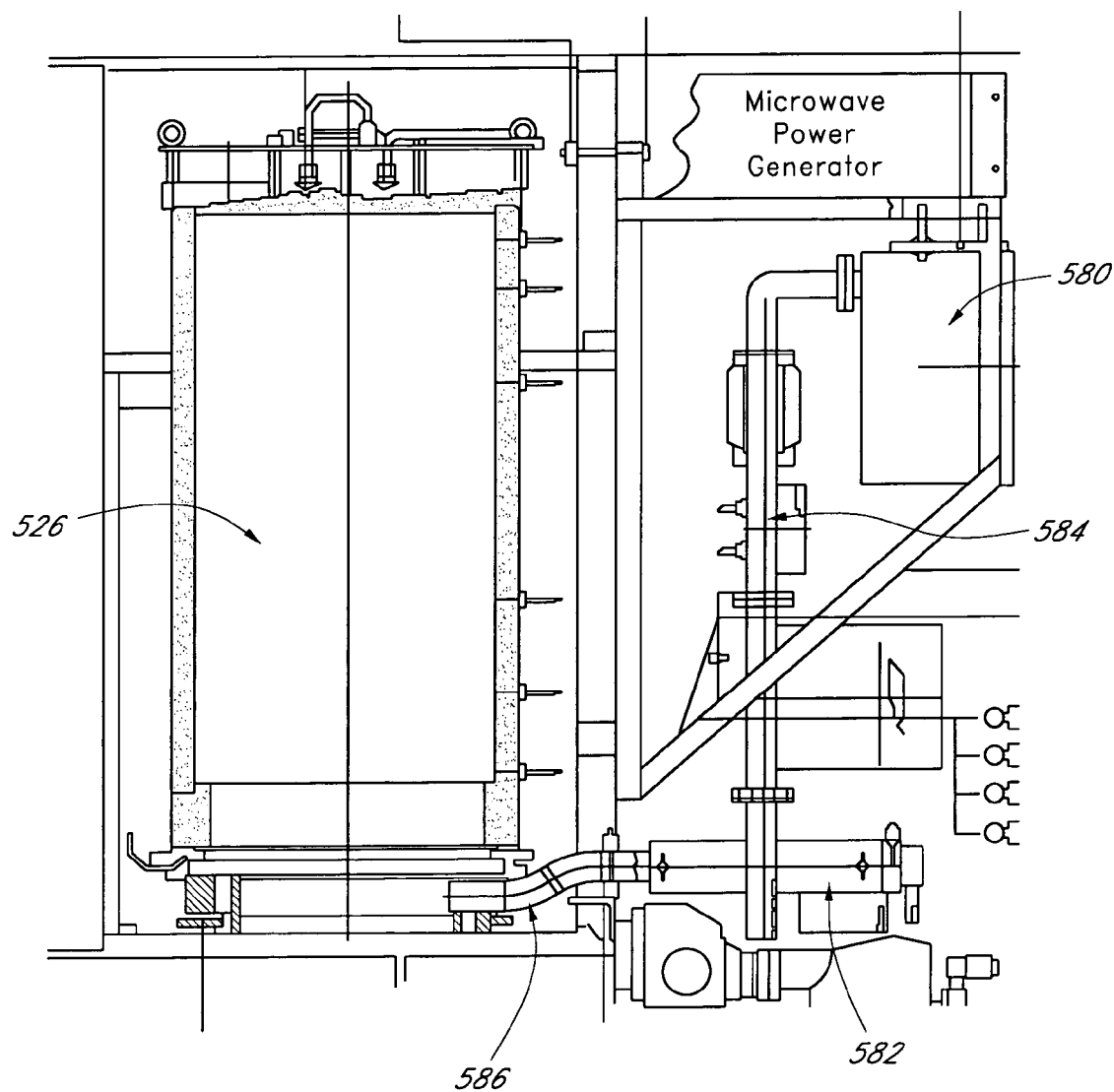
FIG. 4 is a schematic side view of a batch reactor with a remote plasma generator for supplying plasma products to the process tube, in accordance with preferred embodiments of the invention.

With reference to FIG. 4, a process tube 526 is shown in relation to a remote plasma generator. The illustrated remote plasma unit comprises a microwave radical generator (MRG) commercially available from MKS Instruments of Wilmington, Mass., USA, and includes a microwave power generator 580 coupled to a plasma cavity or applicator 582 through which a source of reactant flows during operation. Microwave power is coupled from the power generator 580 through a waveguide 584 to the plasma cavity 582. The reactant source, preferably a source of nitrogen in the illustrated embodiments and, most preferably, diatomic nitrogen gas ($N_2$), flows through the plasma cavity 582 during operation and plasma products are carried to the process chamber 526 by way of a conduit 586. The conduit materials and length are preferably optimized to maximize the delivery of neutral nitrogen species (N) while minimizing recombination into $N_2$ and minimizing delivery of ions, as will be appreciated by the skilled artisan. The conduit can lead to a gas injector of the type illustrated in FIGS. 1-3, or can lead to a more conventional gas inlet, such as in the bottom flange of the process tube 526 from which plasma products (and other reactants) flow upwardly and diffuse laterally across the substrate surfaces.

The use of a remote MRG unit is particularly applicable to the pulsed silicon precursor process of the preferred embodiments. Unlike most batch processes, the nitridation (or other compound forming step) of the preferred embodiments is a self-limiting process in the kinetic regime, such that uniformity of radical distribution within the process chamber 526 is not essential. Over-reaction is not a concern from a result point of view. Nevertheless, non-uniformity of radical distribution is disadvantageous because it will prolong the nitridation process; nitridation would be conducted for a longer time to ensure complete nitridation across each wafer at every vertical position within the process chamber 526. Furthermore, aside from uniformity issues, the distance traversed from the plasma cavity 582 to the process chamber 526, and within the process chamber 526 to reach each wafer, leads to a relatively low radical survival rate due to collisions en route that cause recombination.

Figure 5:
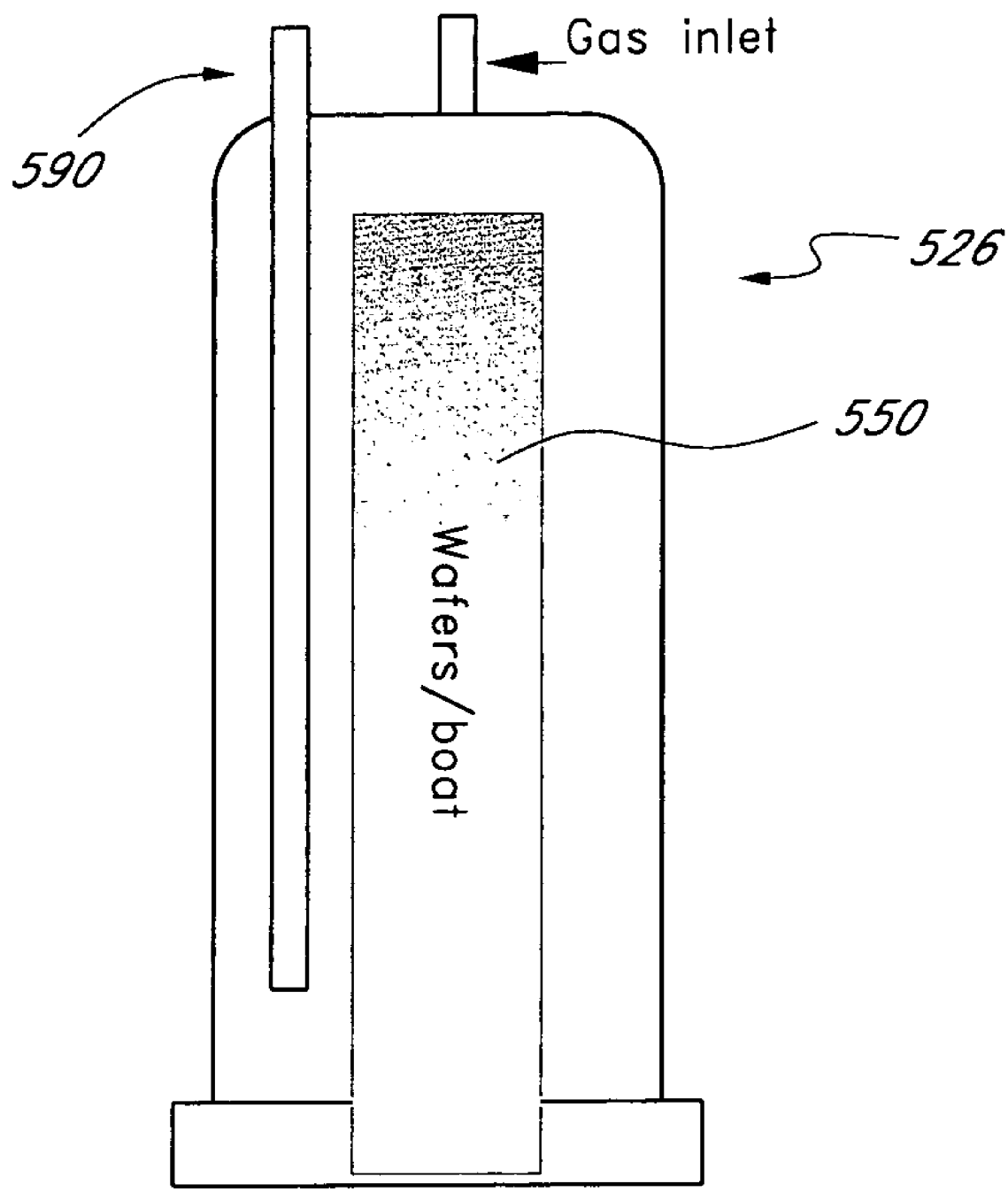
FIG. 5 is a schematic cross section of an in situ plasma source within a batch reaction tube, in accordance with another embodiment of the invention.

With reference to FIG. 5, an in situ plasma source 590 can be provided within the process chamber 526 to improve distribution of radicals across the wafers 550. Preferably the plasma source extends more than about half the height of the process chamber 526 (FIG. 1), more preferably extending at least about 90% of the height of the wafer stack 550 within the process chamber 526.

Figure 6:
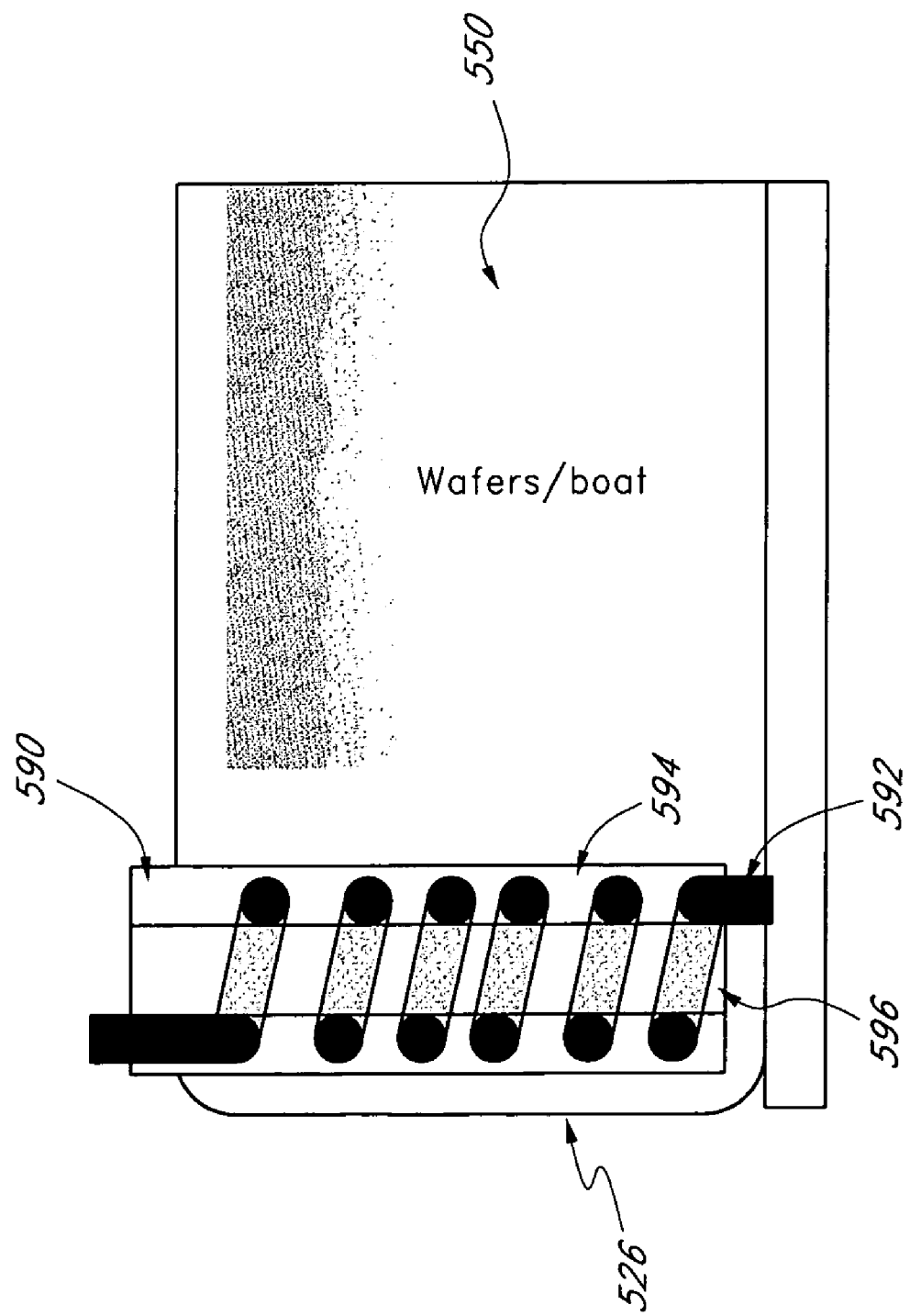
FIG. 6 is an enlarged schematic cross section of the in situ plasma source of FIG. 5.

With reference to FIG. 6, the plasma source 590 includes a conductor coil 592, formed of, e.g., copper, sealed within an insulating sleeve 594, formed of, e.g., quartz or, more preferably, sapphire. Optionally, a conductive core 596, formed of, e.g., iron or ferrite, is also included. The volume (FIG. 1) defined by the insulating sleeve 594 is preferably evacuated to avoid plasma generation within the insulating sleeve 594.

In operation, a current is applied to the coil. A readily available radio frequency (RF) power source, e.g., 13.56 MHz, can be employed for this purpose. Process gases surrounding the plasma source 590, outside the insulating sleeve 594, but inside the process chamber 526 (FIG. 1), are ignited in an annulus surrounding the plasma source 590. Due to the proximity to the wafers 550, lower power can be employed, compared to use of a remote plasma generator. Symmetry of distribution across the wafers can be provided by rotating the wafer boat during operation.

Preferred Silicon Precursor

A silane is preferably used as the silicon precursor. The silane can be selected from the group consisting of monosilane ($SiH_4$), a polysilane and a chlorosilane ($SiH_{4-n}Cl_n$, where n=1 to 4).

Preferably, a polysilane is used as the silicon precursor to form the silicon layer, discussed below. As used herein, a "polysilane" has the chemical formula $Si_nH_{2n+2}$, where n=2 to 4. Preferably, the polysilane is disilane or trisilane. Most preferably, the polysilane is trisilane. Consequently, while the invention is described in the context of particularly preferred embodiments employing CVD cycles with trisilane, the skilled artisan will appreciate, in view of the present disclosure, that certain advantages of the described processes can be obtained with other precursors and/or other deposition techniques.

Trisilane ($H_3SiSiH_2SiH_3$ or $Si_3H_8$) offers substantial benefits when used as a silicon precursor, as disclosed in U.S. application Ser. No. 10/623,482, filed Jul. 18, 2003; U.S. application Ser. No. 10/074,564, filed Feb. 11, 2002; and published PCT Application WO 02/064,853, published Aug. 2, 2002, the disclosures of which are hereby incorporated by reference in their entireties. For example, films can be deposited with trisilane at substantially lower temperatures than with other silicon precursors, such as silane ($SiH_4$). Moreover, deposition rates with trisilane are relatively insensitive to substrate material and thickness. Also, trisilane has an extremely short film nucleation time, which reduces the size of localized crystalline deposits of silicon. As a result, deposited silicon films can be made thinner, while still being uniform. Moreover, the films will show reduced surface roughness due to the reduced size of the localized silicon deposits.

In addition, with regards to process throughput, trisilane exhibits higher deposition rates relative to silane. Trisilane also reduces thermal budgets, since it allows use of lower process temperatures than does silane.

Thus, employing trisilane in the deposition methods described herein provides numerous advantages. For example, these deposition methods enable the production of silicon-containing compound films that are uniformly thin and continuous. These advantages, in turn, enable devices to be produced in higher yields, and also enable the production of new devices having smaller circuit dimensions and/or higher reliability. These and other advantages are discussed below.

Preferred Process Flow

As described in greater detail below, in forming a silicon-containing compound layer, a thin silicon layer is first deposited on a substrate by exposing the substrate to a silicon precursor. The silicon layer can then be reacted with another reactive species to form a silicon-containing compound layer. Multiple sequential cycles of these depositions and reactions can be performed to build up a silicon-containing compound layer to a desired thickness.

Figure 7:
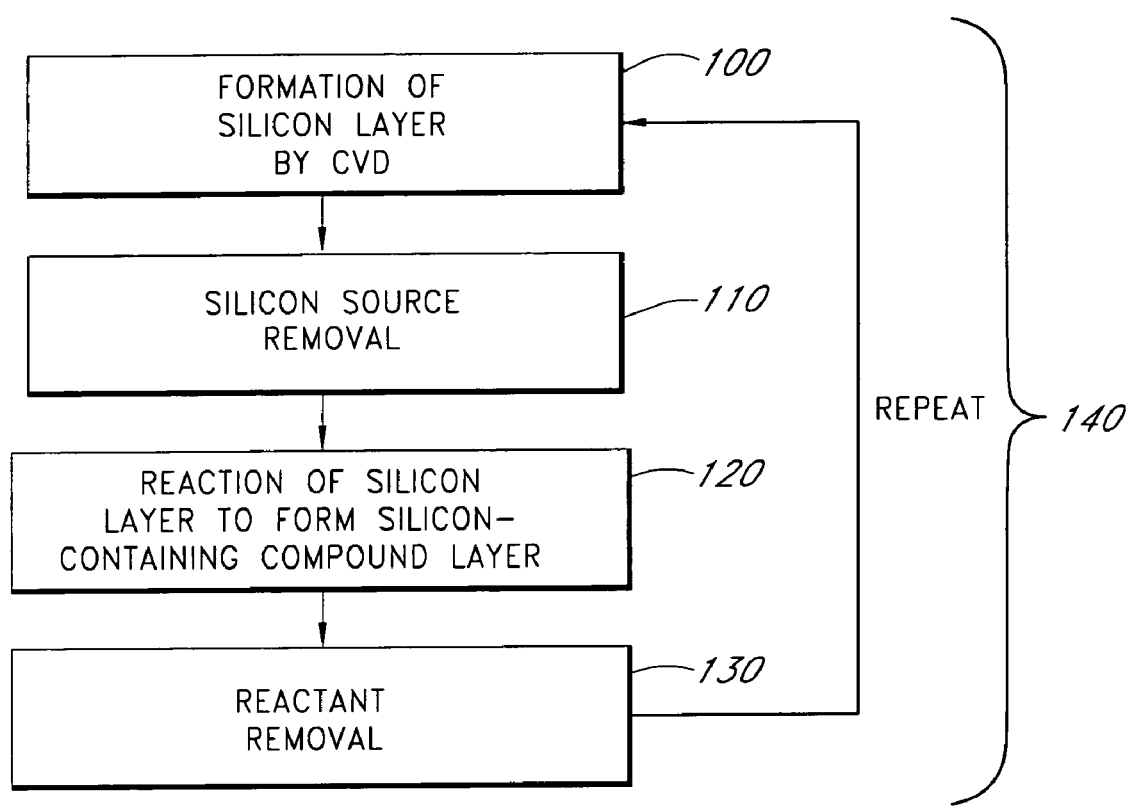
FIG. 7 is a flow chart showing steps for forming silicon-containing compound layers, in accordance with preferred embodiments of the invention.

FIG. 7 shows a general process sequence in accordance with preferred embodiments of the invention. A substrate is provided in a process chamber and all sequence steps are preferably performed in situ in that process chamber. "Substrate" is used herein in its usual sense to include any underlying surface onto which a silicon-containing material is deposited or applied in accordance with the preferred embodiments of the present invention. Preferred substrates can be made of virtually any material, including without limitation metal, silicon, germanium, plastic, and/or glass, preferably silicon compounds (including Si—O—C—H low dielectric constant films) and silicon alloys. Substrates can also have in them physical structures such as trenches or steps, as in a partially fabricated integrated circuit.

In step 100, a silicon layer is deposited on a substrate by exposing the substrate to a silicon precursor. The silicon precursor is preferably a silane, more preferably, a polysilane and, most preferably, trisilane. The silicon precursor is preferably introduced into the process chamber in the form of a feed gas or as a component of a feed gas. The feed gas can include gases other than the silicon precursor, such as inert carrier gases. The carrier gas can comprise carrier gases known in the art, such as nitrogen, hydrogen, helium, argon, or various combinations thereof. Preferably, nitrogen is used as the carrier gas. Where the silicon precursor is trisilane, the trisilane is preferably introduced into the chamber by way of a bubbler used with a carrier gas to entrain trisilane vapor, more preferably, a temperature controlled bubbler is utilized.

In forming 100 the silicon layer, deposition from a silicon precursor can be conducted according to various deposition methods known to those skilled in the art, but the greatest benefits are obtained when deposition is conducted according to the CVD methods taught herein. The disclosed methods can be practiced by employing CVD, including plasma-enhanced chemical vapor deposition (PECVD) or, more preferably, thermal CVD.

Deposition conditions are preferably tailored to processing in the particular type of reactor in which substrates are loaded. In general, deposition conditions are established to supply sufficient energy to pyrolyze or decompose the silicon precursor on a hot substrate surface.

In addition, deposition conditions are preferably established so that the reaction rate of the silicon precursor is the limiting variable for the silicon deposition rate. Thus, the ability of hot wall reactors to achieve highly uniform temperature distributions can advantageously be applied to form uniform layers. While depositions conducted under reaction kinetics limited conditions have deposition rates that are sensitive to temperature changes, the ability to establish high temperature uniformity minimizes the effect of this sensitivity. Moreover, reaction kinetics limited conditions advantageously have deposition rates that are relatively insensitive to supplied reactant concentrations.

It will be appreciated that a reaction kinetics limited regime is primarily achieved by use of a relatively low temperature. This results in a reduced film deposition rate that is preferable in a batch furnace. Because of the large batch size, an adequate throughput can still be achieved at a deposition rate that results from temperatures shifted down into the reaction rate limited regime. Advantageously, trisilane enables acceptable deposition rates at very low temperatures, allowing a considerably reduced consumption of thermal budgets. As the skilled artisan will readily appreciate, thermal budgets are constantly reduced as critical dimensions are scaled down, tolerances for diffusion are reduced, and new materials with lower resistance to thermal processing are introduced. The process is preferably operated at a temperature below about 600° C. and, more preferably, at a temperature below about 500° C., and, even more preferably, at a temperature between about 300° C. and about 500° C.

In addition to temperature, the skilled artisan will appreciate that the kinetic regime is partially dependent upon the reactant supply or partial pressure of the silicon precursor. Preferably, the reaction rate is slower than the rate at which reactant is supplied.

The thickness of the film formed in Step 100 can be varied according to the intended application, as known in the art, by varying the deposition time and/or gas flow rates for a given set of deposition parameters (e.g., total pressure and temperature). For a particular set of deposition conditions, the duration of silicon deposition for silicon layer formation 100 is preferably chosen so that a thin silicon layer is formed. By forming thin and uniform silicon layers, the layers can be easily fully reacted, allowing for the formation of uniform silicon-containing compound layers. Preferably, the thickness of the silicon layer is more than a monolayer of silicon, but is less than about 20 Å and, more preferably, less than about 10 Å.

With continued reference to FIG. 7, after silicon layer formation 100, any excess silicon precursor and byproduct is removed 110 from the process chamber. Silicon precursor removal 110 can occur by any one, or any combination of removal processes, including the following: purging of the process chamber with inert gas, evacuation of the silicon precursor, or displacement of the silicon precursor gas by a gas carrying a reactive species. Where silicon precursor gas removal 110 is performed by purging, the process chamber is preferably purged for a duration long enough to replace the atmosphere in the chamber at least once.

It will be appreciated that silicon precursor gas removal 110 is preferably performed such that the quantity of a particular reactant in the process chamber is at a level sufficiently low as to minimize unwanted side reactions with the next reactant to enter the chamber. This, in turn, minimizes undesirable incorporation of impurities in the silicon-containing compound layers that are formed. Such a low level of reactants can be achieved by, for example, optimizing the duration of a purge or evacuation of the reaction chamber. At such a level, the process chamber can be said to be substantially free of a particular reactant.

With continued reference to FIG. 7, after silicon precursor gas removal 110, the silicon layer can be reacted 120 with a reactive species to form a silicon-containing compound layer. The silicon-containing compound layer can be formed by introduction of the reactive species into the process chamber. Preferably, the reaction conditions are chosen to completely react the silicon layer and to avoid damage to underlying structures, e.g., as discussed in more detail herein with respect to the formation of silicon nitride layers. The reactive species can include, as noted, a reactive nitrogen species for forming silicon nitride layers, or a reactive oxygen species for forming silicon oxide layers. Exemplary reactive nitrogen species include chemical species such as $(H_3Si)_3N$ (trisilylamine), ammonia, atomic nitrogen, hydrazine $(H_2N_2)$, hydrazoic acid $(HN_3)$, $NF_3$, mixtures of the foregoing and dilutions of the foregoing with inert gases (e.g., $H_2$, $N_2$, Ar, He). More preferably, nitrogen radicals and/or ammonia are the reactive nitrogen species, as discussed below.

With continued reference to FIG. 7, after formation of the silicon-containing compound layers 120, reactant removal 130 can be performed using any of the methods described above for silicon precursor removal 110. It will be appreciated, however, that Steps 110 and 130 need not occur by exactly the same methods, e.g., one step can involve purging, while the other can involve evacuating.

Accordingly, performance of the steps 100, 110, 120, and 130 comprises one cycle 140 and deposits one layer of a silicon-containing compound on a substrate. The cycle 140 can then be repeated until the silicon-containing compound layers are built up to a desired thickness.

It will be appreciated that various other layers can be formed over the deposited silicon compound layer. For example, where the silicon compound layer is a silicon nitride which forms a gate dielectric, a gate electrode can be formed over the gate dielectric, by methods known in the art.

Figure 8A:
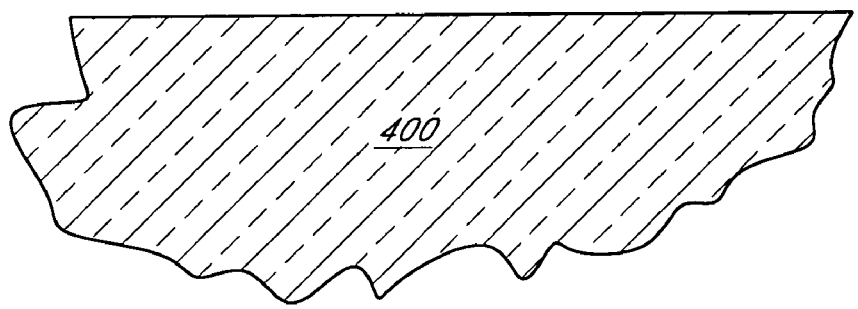
FIG. 8A illustrates a substrate after wafer cleaning, in accordance with preferred embodiments of the invention.
Figure 8B:
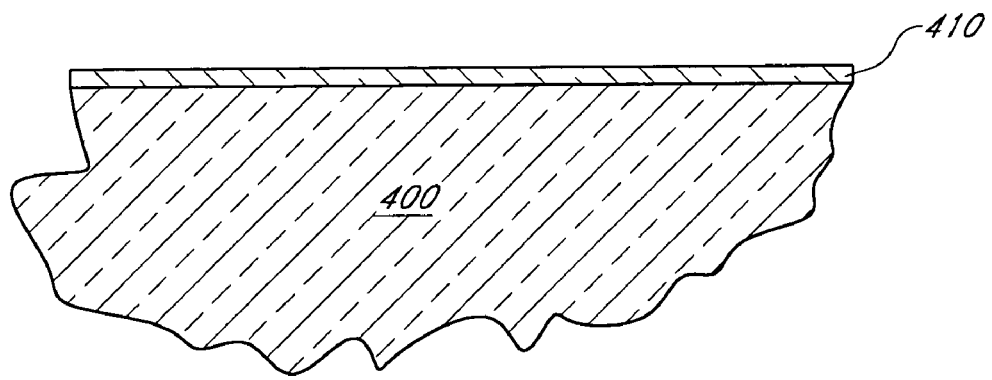
FIG. 8B illustrates the substrate of FIG. 8A after formation of a silicon oxide layer, in accordance with preferred embodiments of the invention.
Figure 8C:
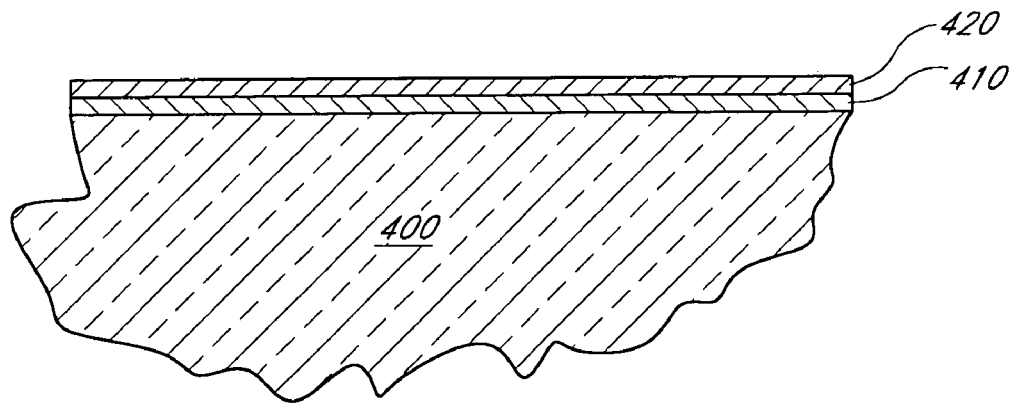
FIG. 8C illustrates a silicon nitride layer formed over the silicon oxide layer of FIG. 8B, in accordance with preferred embodiments of the invention.
Figure 8D:
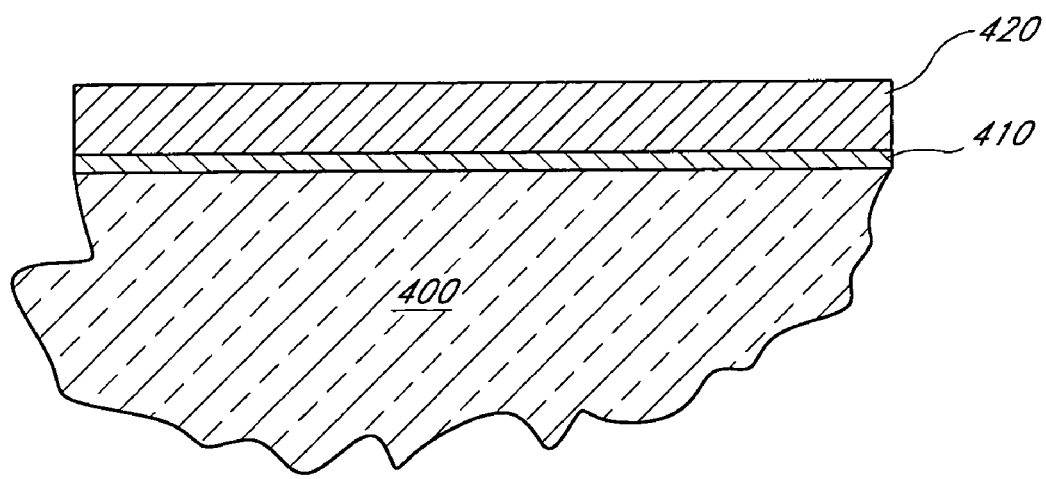
FIG. 8D illustrates the silicon nitride layer of FIG. 8C made thicker by formation of subsequent silicon nitride layers over the silicon nitride layer of FIG. 8C, in accordance with preferred embodiments of the invention.
Figure 8E:
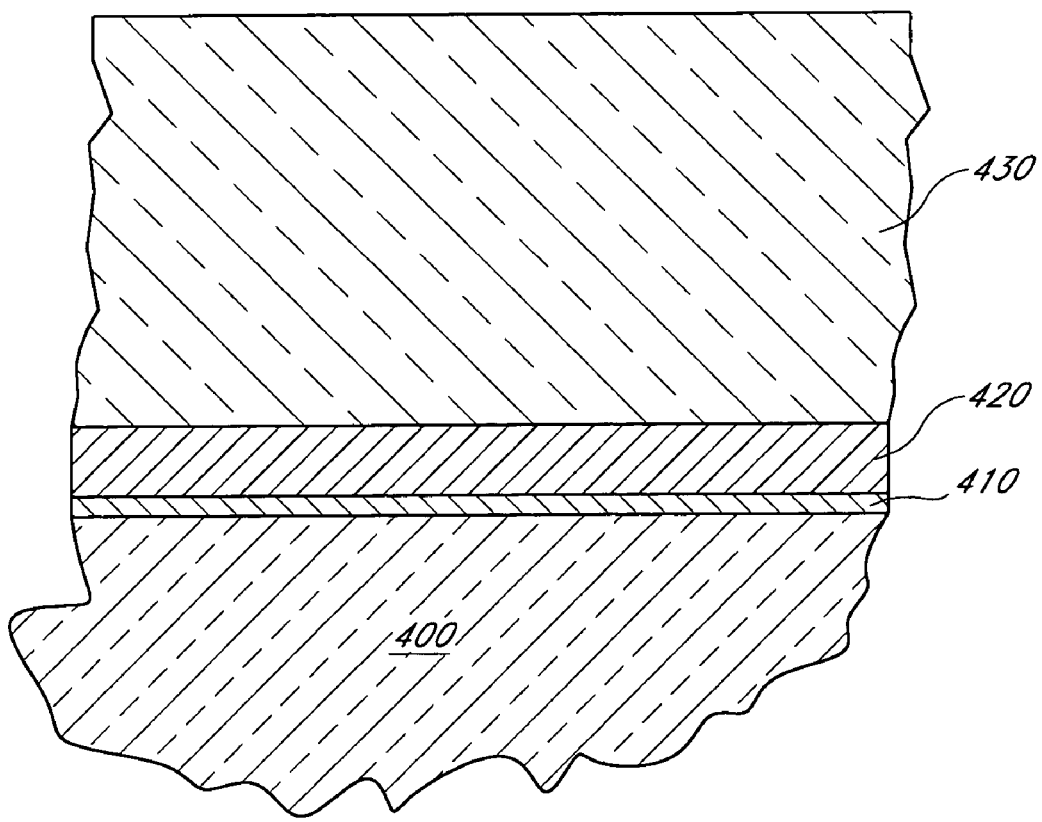
FIG. 8E illustrates a gate electrode formed after the silicon nitride layer of FIG. 8D has been formed to a preferred thickness, in accordance with preferred embodiments of the invention.

Referring to FIGS. 8A through 8E, the result of the above-described process, applied to forming a gate dielectric, is shown in stylized illustrations. FIG. 8A illustrates a substrate 400 after wafer cleaning. It will be appreciated that wafer cleaning prior to a deposition can be performed by various ex situ and in situ methods known in the art. FIG. 8B illustrates an interfacial layer 410 is formed over the substrate 400 to improve electrical performance of the deposited layers. The interfacial layer 410 can be, e.g., a silicon oxide layer, which is formed ex situ or in situ according to methods known in the art, including but not limited to thermal or chemical oxidation or other methods involving exposing the substrate to oxidant. FIG. 8C illustrates a silicon nitride layer 420 formed by performing a first cycle 140 (FIG. 7) over the interfacial layer 410. FIG. 8D illustrates the silicon nitride layer 420 made thicker by subsequent additional performances of cycles 140 (FIG. 7). FIG. 8E illustrates a subsequently formed gate electrode 430.

It will be appreciated that in some embodiments, the silicon-containing compound layer can subsequently be reacted after step 130 (FIG. 7) in each cycle 140, or after completing all cycles 140. For example, silicon-containing compound layers that serve as semiconductors (e.g., SiGe) can subsequently be doped. In another example, a silicon oxynitride $(SiO_xN_y)$ layer can be formed from a silicon nitride layer by introducing an oxygen source to oxidize the silicon nitride, to form silicon oxynitride. It will be appreciated that such a silicon oxynitride layer can be used as an interfacial layer for forming dielectric layers in place of the silicon oxide layer described above with reference to FIGS. 8A to 8E. Silicon carbide nitride $(SiC_xN_y)$ or silicon oxycarbide $(SiO_xC_y)$ can similarly be formed by a subsequent carbonization, nitridation or oxidation step.

In some embodiments, different silicon sources can be used in different cycles 140 (FIG. 7). For example, trisilane can be used as the silicon precursor for one cycle, and disilane can be used for another cycle. Preferably, trisilane is used to form at least the first silicon layer deposited on a substrate in the first performance of cycles 140 (FIG. 7). Subsequent silicon layers can be formed using, e.g., halosilanes (i.e., silicon compounds having the chemical formula $R_{4-x}SiH_x$, where R=Cl, Br or I and X=0 to 3) or other silanes ($Si_nH_{2n+2}$ where n=1 to 4, with n≧2 preferred). It will also be appreciated that combinations of silicon precursors can be used, e.g., trisilane and disilane can be used simultaneously after forming the first silicon layer.

It will be further appreciated that the temperatures for Steps 100 (FIG. 7) for each cycle 140 is preferably isothermal, but can also vary for different cycles 140. For example, a silicon layer formation 100 can occur at a first temperature that is less than about 525° C., preferably less than about 500° C., and most preferably less than about 475° C. Preferably, the layer is then allowed to stand for several seconds to allow for complete elimination of the hydrogen from the as-deposited silicon layer, prior to forming a silicon-containing compound layer 120 (FIG. 7). Preferably, the layer is allowed to stand for more than 10 seconds. For formation of the silicon-containing compound layer 120 (FIG. 7), the temperature is then increased to a second temperature that is higher than the first temperature. Preferably, subsequent cycles 140 (FIG. 7) are performed isothermally at this second higher temperature to deposited a silicon-containing compound layer of a desired thickness. Such a process is particularly useful for silicon nitride film deposition on substrate surfaces other than crystalline silicon (e.g., $SiO_2$, low dielectric constant spin on glass materials, metal oxides, metal silicates and metals), as the low temperature and hydrogen elimination period give a film with low hydrogen content at the interface with the substrate surface. Advantageously, the higher temperatures for subsequent deposition cycles allows for faster depositions and increased throughput after formation of the low hydrogen interface.

It will also be appreciated that any of the steps or combinations of the steps 100-130 in a cycle 140 can be performed a plurality of times before progressing to the next step. For example, a plurality of silicon precursor pulses, each followed by a silicon precursor source removal, can be performed to form a silicon layer, before the silicon layer is reacted to form a silicon-containing compound layer. Similarly, a plurality of reactive species pulses, each followed for a reactive species removal, can be performed to react the silicon layer to form a silicon-containing compound layer, before or without forming another silicon layer.

Deposition of Silicon Nitride Films

Figure 9:
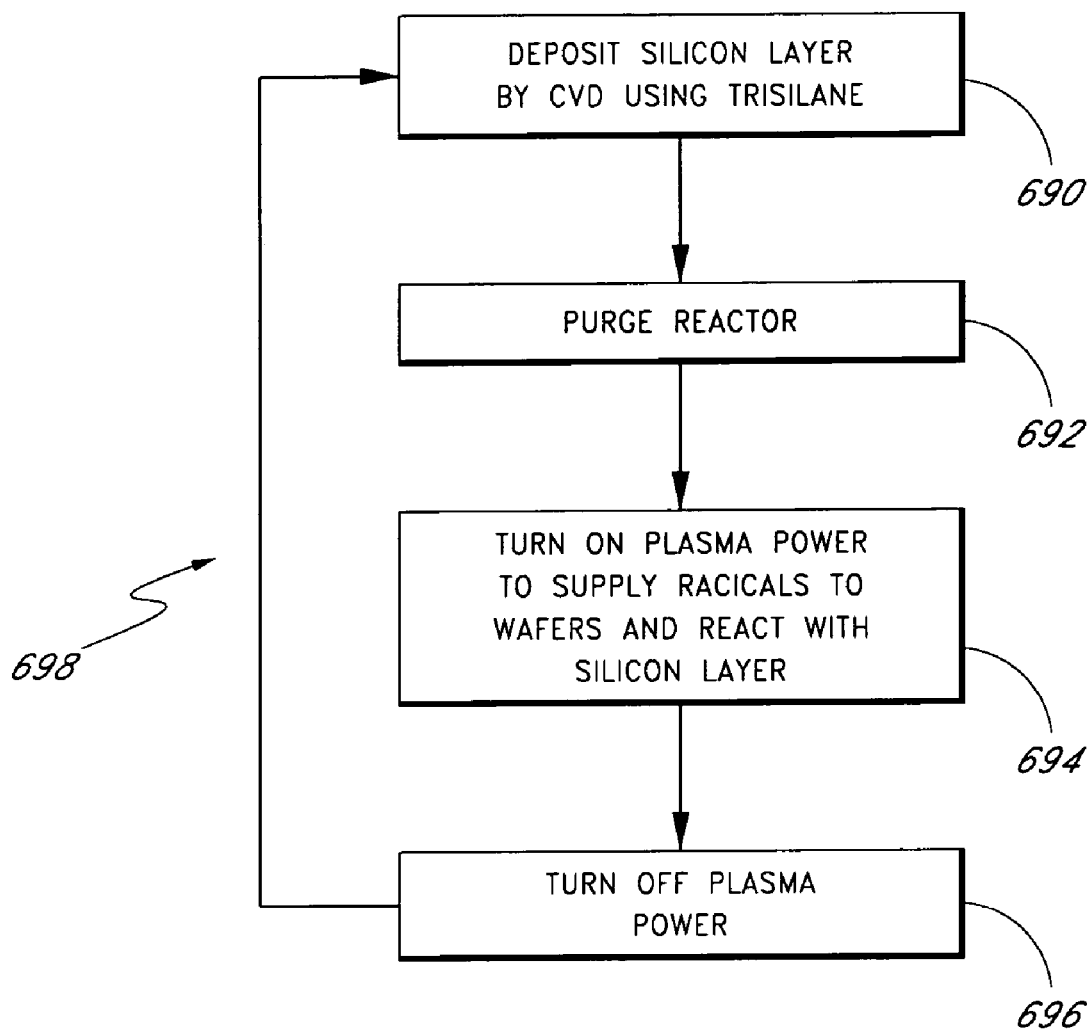
FIG. 9 is a flow chart showing a process for forming silicon nitride in a batch reactor, in accordance with some preferred embodiments of the present invention.

FIG. 9 illustrates a process for the deposition of silicon nitride layers, in a manner more particular in certain aspects to the use of radicals for reacting with the trisilane-enabled silicon layer and for forming the silicon compound layer.

With reference to FIG. 9, a silicon layer is first deposited 690 by flowing trisilane. As noted, process conditions are arranged for deposition in the kinetic regime. The process is preferably operated at a temperature below about 600° C. and, more preferably, at a temperature below about 500° C., and, even more preferably, at a temperature between about 400-450° C. In addition, the reactant supply or partial pressure of trisilane is set at a sufficiently low level to maintain the deposition in the kinetic regime. As long as the reaction rate is slower than the rate at which reactant is supplied, uniformity in a properly tuned batch furnace (in which uniform temperatures can be maintained) is excellent. Reference is made to Sze, *VLSI TECHNOLOGY*, pp. 240-41 (1988), the disclosure of which is incorporated herein by reference. In the illustrated batch reactors, process pressure is maintained at about 10 Torr or below and more preferably about 1 Torr or below. In order to maintain reaction rate limited deposition, trisilane preferably is supplied at less than about 100 sccm trisilane, and, more preferably, at less than about 20 sccm. The trisilane is typically diluted with a flow of a non-reactive or inert gas such as $N_2$, $H_2$, Ar or He. The trisilane partial pressure is thus preferably below about 10 mTorr, more preferably, about 3-4 mTorr. Preferably, the trisilane step 690 has a duration of about 30-120 seconds. Preferably, about 3-30 Å of silicon are deposited in the deposition step 690, more preferably, about 3-8 Å and, most preferably, about 4-5 Å.

Preferably, the thickness of the deposited silicon layer thickness is chosen based upon nitridation conditions in the step 694, discussed below. This is because, during nitridation of a silicon layer, atomic nitrogen can diffuse through the silicon layer and into the underlying silicon substrate. The depth of this nitrogen diffusion can be measured, as known in the art, and is related to various process conditions, including nitridation temperature and duration of nitridation. Thus, for a given set of process conditions, atomic nitrogen will diffuse into, and possibly through, the silicon layer to a particular depth, called the nitridation saturation depth. When nitridation occurs for less than about one minute, the nitridation saturation depth can be termed the short-term nitridation saturation depth.

The nitridation of the underlying substrate has been found to result in silicon nitride layers with dielectric properties which are inferior to what is theoretically expected. Thus, to improve the dielectric properties of deposited silicon nitride films, nitridation of the underlying substrate is preferably minimized, preferably by depositing the first silicon layer formed over a substrate to a thickness equal to or greater than the nitridation saturation depth. It will be appreciated that subsequently deposited layers will typically be spaced farther from the substrate than the nitridation saturation depth, as a consequence of being deposited over this first silicon layer. As a consequence, the thickness of silicon layers deposited after the first layer preferably are less than or equal to the nitridation saturation depth.

For a given set of nitridation conditions, however, after forming the first silicon layer, silicon layers formed in subsequent cycles can be thinner since the nitridation saturation depth remains relatively constant while the silicon nitride layer thickness increases. For example, the first silicon layer can be deposited to about the nitridation saturation depth, e.g., about 8 to 20 Å, and subsequent layers can be deposited to a thinner thickness, e.g., about 3 Å to 10 Å per cycle. In addition to varying the thickness of the silicon layer, it will be appreciated that other process conditions, such as the nitridation temperature and/or the duration of nitridation, can be varied so that the nitridation saturation depth is not deeper than the thickness of the silicon layer.

After the deposition step 690, trisilane flow is interrupted. In the illustrated embodiment the reactor is purged 692, preferably for 10 seconds to 5 minutes, and most preferably for about 20-40 seconds. Purging 692 avoids interaction between the trisilane and the subsequent radicals, which can undesirably cause gas phase reactions and particles. An exemplary purge flow for a batch reactor is 5 slm $N_2$. While other non-reactive gases can be used, $N_2$ has particular advantages for efficiency in the nitridation process described herein.

Subsequently activated species are supplied to react with the thin silicon layer left by the deposition step 690. In the illustrated embodiment, nitrogen gas ($N_2$) has been flowing in prior purge step 692. Accordingly, the activated species can be supplied by simply continuing the $N_2$ flow and turning on plasma power 694 to activate nitrogen radicals. The skilled artisan will appreciate that the same can be true of many other reactants that are non-reactive under the very low temperature conditions that are preferred for the trisilane deposition, but that can be activated by turning on plasma power to form radicals that react with the silicon layer and form a silicon compound. Additionally, the plasma power can be turned on for a remote plasma generator (FIG. 4) or for an in situ plasma source (FIGS. 5-6).

In a preferred embodiment, the nitrogen radicals are generated by the application of high frequency electrical power. In a preferred embodiment, this high frequency is in the GHz range. In one example, the nitrogen radicals are generated in a remote microwave radical generator (MRG) from MKS Instruments by flowing 1 to 5 slm $N_2$ through the MRG under the application of 3 kW microwave power at 2.45 GHz. Optionally, the remotely generated radicals can be distributed over the entire wafer load by the use of one or more gas injectors. Alternatively, the nitrogen radicals can also be generated inside the furnace chamber, preferably over the entire length of the vertically elongated chamber. This can be achieved by the coupling of high frequency electrical power into the process tube. In the embodiment of FIGS. 5 and 6, this coupling occurs through a coil 592 that is inserted into the process chamber 529 (FIG. 1). As noted above, the coil 592 is preferably placed inside a protective sleeve 594 of electrically insulating material, and this sleeve 594 is preferably evacuated to pressures below about 100 mTorr to avoid the generation of plasma inside the sleeve 594.

During radical reaction step 694, the pressure is typically about 1 Torr. For N radicals generated from $N_2$ gas, for example, the nitridation time is typically 5 to 10 minutes. Depending upon the thickness of the silicon formed by the deposition step 690, the thickness of the silicon compound (nitride in this case) formed is preferably about 5-40 Å, more preferably, about 5-11 Å, and, most preferably, about 5-7 Å.

Preferably, nitridation of the silicon layers is complete and results in a substantially perfect stoichiometry in the reaction of the silicon layer with the reactive nitrogen species. Such a complete reaction allows less incorporated impurities, denser films, and improved thickness control and step coverage. In addition, the deposited silicon nitride layers have improved insulating properties, and can be made thicker than conventional insulating thin films, increasing the effectiveness of these deposited layers as diffusion barriers.

After complete reaction of the thin silicon layer to form a compound silicon layer, the plasma power is switched off 696. In the case of $N_2$ gas, switching off the plasma power while continuing the $N_2$ flow leads to purging, and the radicals die off rapidly without the power on, such that reaction with any subsequent trisilane step 690 can be readily avoided.

Optionally, the steps 690-696 can be repeated 698 as many times as desired, with each cycle depositing 690 a layer of silicon thin enough that it can be quickly and fully reacted by radicals in step 696. For trisilane pulses of 1.5 min, a film thickness of 5-6 Å nitride is created in one cycle of silicon deposition and nitridation.

It will be appreciated that formation 594 of the silicon-compound layer can include reaction of the silicon layer with more than one reactive species, even where the atomic species of interest for the different reactive species is the same. For example, for nitridation, a beneficial effect was observed by the use of an $NH_3$ flow in addition to a nitrogen radical flow. This $NH_3$ was fed directly into the process tube, rather than via the radical generator. Although non-activated $NH_3$ hardly reacts with silicon at temperatures below 500° C., it was noted that the addition of non-activated $NH_3$ to the nitrogen radicals resulted in a more fully nitridized amorphous silicon layer. Without wishing to limited by theory, it is believed that the nitrogen radicals from a remote plasma generator activate the ammonia within the process chamber. In contrast, N radicals alone leave a slightly silicon-rich silicon nitride film. Interestingly, ammonia provided through the remote MRG actually decreased the nitridation effect, even relative to N radicals alone.

Figure 10:
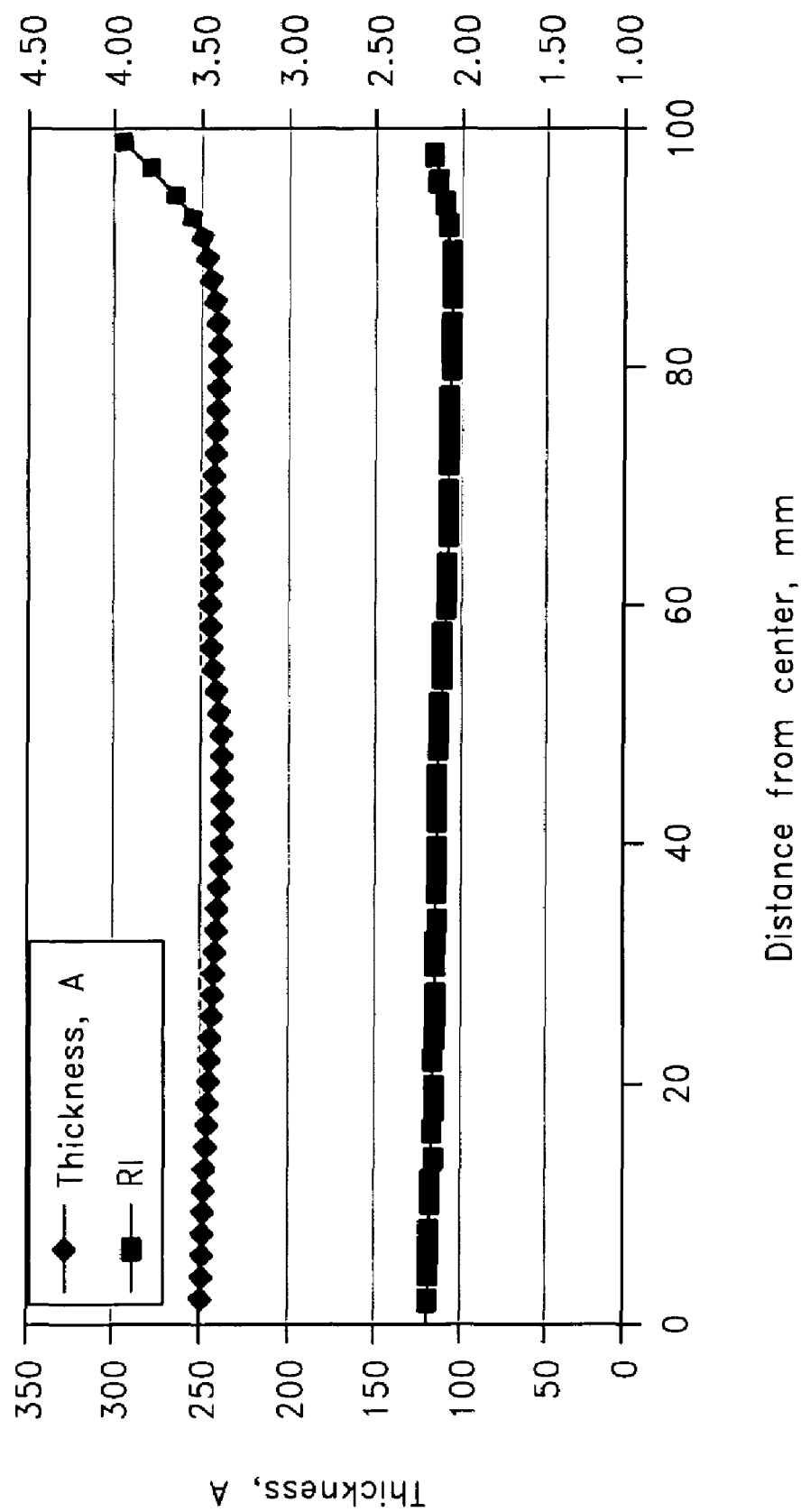
FIG. 10 is a graph illustrating thickness and refractive index (RI) for deposited silicon nitride layers, in accordance with some preferred embodiments of the present invention.

FIG. 10 illustrates the results of experiments, in a batch A412™ reactor from ASM International N.V. of Bilthoven, The Netherlands, in which substrates were maintained at about 435° C. and the wafer boat was rotated at 5 rpm. Reaction rate limited deposition conditions were established. In silicon deposition pulses of 1.5 minutes, trisilane was provided through the inlet at the bottom of the reactor to produce a trisilane partial pressure of about 3.3 mTorr. $N_2$ was provided through an MRG at a rate of 5 slm. After trisilane flow was interrupted and purged for about 30 seconds, remote plasma power was turned on at a level of 3,000 W for about 10 minutes. In addition, a flow of 1 slm $NH_3$ was provided through the bottom of the process chamber. During the nitridation step, the pressure in the reaction chamber is typically 1 Torr. Fifty cycles were performed to form a silicon nitride layer having a thickness of about 257 Å.

The flow of nitrogen radicals is applied alternatingly with the flow of trisilane. When the nitrogen radicals are flowing simultaneously with the trisilane, gas phase reactions tend to occur resulting in the undesirable formation of particles and non-uniform films. The flow of $NH_3$, if any, can be applied alternatingly with the flow of trisilane or can be applied in a continuous fashion, so that the $NH_3$ is also flowing during the trisilane pulses. As noted, since $N_2$ and $NH_3$ are non-activated when the plasma power is off (purge steps and silicon deposition steps), neither gas reacts very much under the preferred temperature conditions in the absence of plasma power, and benefits can be obtained by a constant supply of the gases, such as avoidance of pressure fluctuation.

While in the experiments all gases were provided through the bottom of the vertical reactor and exhausted from the top, it will be understood in view of the present disclosure that benefits can be obtained by other injection arrangements. Optionally, the process gases can also be injected via gas injection tubes or multiple hole injectors (see FIGS. 2-3) to improve the uniformity over the entire batch. In the case where trisilane is provided through such injectors, $N_2$ can also be provided through the same injectors, acting as a carrier gas during trisilane pulses and as a reactant (whether remotely activated or activated in situ) during nitridation (or other reaction) pulses, and as a purge gas between the trisilane and the nitrogen pulses. Under the low temperatures of the preferred embodiments, ammonia can also be provided simultaneously or intermittently (with plasma power) through the injector or through the bottom inlet.

As noted above, although the process is described using a nitride film deposition process as an example, it will be clear that other silicon compound layers can be deposited in this manner such as silicon carbide, silicon oxide, silicon oxynitride and silicon germanium layers. In such embodiments, the deposited silicon film from a trisilane step is carbonized, oxidized, oxynitrided or exposed to germanium precursors in between successive trisilane pulses. For example, silicon oxides can also be formed by introducing an oxygen source during formation of a silicon-containing compound layer 120 (FIG. 7), rather than introducing a nitrogen source. The oxygen source can include oxidants known in the art including, but not limited to, atomic oxygen, water, ozone, oxygen, nitric oxide, and nitrous oxide.

One skilled in the art will appreciate that further modifications to the batch reactor, or to the way of operating the batch reactor, known in the art, can be applied to improve the performance of this process. For example, it is possible to use a holder boat or ring boat to improve the uniformity of film deposition over each wafer.

Deposited Silicon-Containing Compound Layers

Desirably, preferred silicon-containing compound films according to the preferred embodiments have a thickness that is highly uniform across the surface of the film. Film thickness uniformity is preferably determined by making multiple-point thickness measurements, e.g., by ellipsometry or cross-sectioning, determining the mean thickness by averaging the various thickness measurements, and determining the rms thickness variability. To enable comparisons over a given surface area, the results can be expressed as percent non-uniformity, calculated by dividing the rms thickness variability by the average thickness and multiplying by 100 to express the result as a percentage. Preferably, the thickness non-uniformity is about 20% or less, more preferably about 10% or less, even more preferably about 5% or less, most preferably about 2% or less.

Suitable methods for measuring film thickness include multiple-point ellipsometric methods. Instruments for measuring film thickness are well known and commercially available. Preferred instruments include the NanoSpec® series of instruments from Nanometrics, Inc., Sunnyvale, Calif. The thickness of a silicon-containing compound film can also be determined by cross-sectioning the substrate and measuring the thickness by an appropriate microscopy technique, most preferably by electron microscopy. The span over which a thickness is measured can be any span in the range of from about 10 times the thickness of the film to the entire span of the silicon-containing compound film. If the film thickness varies over the span, then the thickness is considered to be the average thickness, i.e., the numerical average of the thickest and thinnest dimensions of the film over a given span.

As used herein, rms (more properly, the square root of the mean squared error) is a way of expressing the amount of variability exhibited by the members of a given population. For example, in a group of objects having an average weight of y grams, each member of the group has a weight y' that differs from the average by some amount, expressed as (y'−y). To calculate rms, these differences are squared (to ensure that they are positive numbers), summed together, and averaged to yield a mean squared error. The square root of the mean squared error is the rms variability.

In addition to thickness uniformity, preferred silicon-containing compound films preferably provide a conformal coating over varied topography. A conformal coating is a layer that follows the curvature, if any, of the structure that it overlies. The conformal silicon-containing compound films preferably exhibit good step coverage. "Step coverage" refers to the thickness uniformity of a conformal film that overlies a stepped surface. A stepped surface is a surface that has two or more parallel components that are not disposed in the same horizontal plane. Step coverage is preferably determined by measuring the average thickness of the film at the bottom of the step, dividing it by the average thickness at the top of the step, and multiplying by 100 to express the result in percentage terms.

The preferred silicon-containing compound films have good step coverage even at relatively high aspect ratios. "Aspect ratio" refers to the ratio of the vertical height of the step to the horizontal width of the structure. At an aspect ratio in the range of about 4.5 to about 6, preferred silicon-containing compound films have a step coverage of about 70% or greater, more preferably 80% or greater. At an aspect ratio in the range of about 1 to about 4, preferred silicon-containing compound films have a step coverage of about 80% or greater, more preferably 90% or greater. Step coverage is preferably calculated as stated above, but can also be calculated by taking into account sidewall thicknesses. For example, alternate definitions of step coverage involve the ratio of the sidewall thickness to the average thickness at the top and/or bottom of the step. However, unless otherwise stated, step coverage herein is determined as stated above by measuring the average thickness of the horizontal portions of the silicon-containing compound film at the bottom of the step, dividing it by the average thickness of the horizontal portions at the top of the step, and multiplying by 100 to express the result in percentages.

Advantageously, surface smoothness and thickness of the preferred silicon-containing compound films are maintained over a surface area of about one square micron ($\mu m^2$) or greater, more preferably about 5 $\mu m^2$ or greater, even more preferably about 10 $\mu m^2$ or greater. The silicon-containing compound film can cover all or part of a large substrate, e.g., a wafer, and thus can have a surface area of about 300 $cm^2$ or greater, preferably about 700 $cm^2$ or greater.

Since good step coverage is usually achieved, in many cases the surface roughness of the silicon-containing compound film is substantially the same as the roughness of the surface that it overlies. Surface roughness is preferably rms surface roughness as measured by atomic force microscopy (AFM) on a 1 micron×1 micron portion of the surface in question. The roughness of the underlying substrate surface can range from about 1 Å rms (atomically flat surface) up to about 25 Å rms or even higher. Preferably, the underlying substrate surface has a roughness of 10 Å rms or less, more preferably 5 Å rms or less, so that the overlying silicon-containing compound film has a comparable roughness. For an underlying substrate surface having a given degree of roughness, the silicon-containing compound film deposited thereon preferably has a surface roughness that is greater than the substrate surface roughness by an amount of about 5 Å or less, more preferably about 3 Å or less, even more preferably about 2 Å or less. For example, if the substrate surface roughness is about 7 Å rms, then the measured surface roughness of the silicon-containing compound film deposited thereon is preferably about 12 Å rms (7 Å+5 Å) or less. Preferably, the underlying surface has a roughness of about 2 Å rms or less and the overlying silicon-containing compound film has a measured surface roughness of about 5 Å rms or less, more preferably about 3 Å rms or less, most preferably about 2 Å rms or less.

The silicon compound layer films formed according to the preferred embodiments also show excellent stoichiometry and purity. These advantages are evident in the results shown in FIG. 10 for the silicon nitride layers in which trisilane was used as the silicon source and activated $NH_3$ and $N_2$ were used as the nitrogen sources.

Analysis of the films indicates a substantially stoichiometric silicon nitride film, as the silicon nitride was found to have a stoichiometry of about $Si_{45}N_{56}$, or a ratio of about 1.25 nitrogen atoms per silicon atom, approximately equal to perfectly stoichiometric silicon nitride, $Si_3N_4$, which has a ratio of about 1.33 nitrogen atoms per silicon atom. In addition, the silicon nitride film showed excellent compositional purity, with the hydrogen concentration within the film at less than about 0.8 atomic percent. Thus, analysis of the silicon nitride films showed the films to have excellent purity and stoichiometry.

Advantageously, the high conformality and physical and chemical uniformity of silicon-containing compound layers formed in accordance with the preferred embodiments have improved physical properties relative to similar layers formed by conventional processes. For example, it has been found that insulating layers of silicon compounds, e.g., silicon nitride and silicon oxide, have worse than theoretically expected insulating properties due in part to reaction of the underlying substrate when forming the silicon compound and also due to incorporated impurities, such as incorporated hydrogen. Desirably, the preferred insulating layers have low incorporated hydrogen and minimized reactions of the underlying substrate, resulting in improved insulating properties.

In particular, silicon nitride films formed according to the present invention can be used in applications where other compounds, such as silicon oxynitrides, have traditionally been favored. Desirably, due to its different materials properties in comparison to silicon oxynitrides, use of silicon nitride in such applications results in a layer with a higher dielectric constant and better barrier properties.

In addition, in forming silicon nitride layers, the process temperature is preferably reduced relative to a conventional CVD process utilizing silane. As such, nitrogen diffusion towards a silicon channel can be reduced in gate dielectric applications where the amount of nitrogen at the silicon-dielectric interface must be carefully controlled and limited.

Moreover, because of its high dielectric constant, silicon nitride layers can be superior in some applications, such as for gate dielectrics. This is because, as device critical dimensions continue to shrink, the utility of traditional materials such as $SiO_2$ for gate dielectric applications is decreasing due to limitations arising from the fundamental materials properties of silicon oxides. These limitations are particularly acute for physical thicknesses below about 15 Å, when quantum mechanical tunneling becomes a dominant mechanism for current leakages through the dielectric layer. In addition, ultra-thin $SiO_2$ layers are poor barriers to the diffusion of electrically active dopant atoms. Consequently, insulating thin film materials with a dielectric constant greater than that of $SiO_2$ have been determined to be desirable in order to improve leakage current performance and to act as better barriers to dopant atom diffusion. In addition to gate dielectric applications, silicon nitride films can also be employed as spacers in a number of transistor applications. For all of these applications, the thin silicon nitride films preferably have exceptional properties with regard to leakage current performance. In addition, for gate dielectric application, the thin silicon nitride films preferably exhibit superior electrical performance from a carrier mobility perspective, which implies that they have low interfacial trap density (i.e., an acceptable interface with the crystalline semiconductor surfaces onto which they will be deposited).

While conventional silicon nitride films, by virtue of the higher dielectric constant of silicon nitride itself, has theoretically appeared to fit this need, in practice, silicon nitride films formed by conventional CVD processes have not exhibited the physical and electrical properties required for gate dielectric applications. Typically, these films have exhibited leakage currents only marginally better than that of $SiO_2$ at comparable physical thicknesses. It is believed that this has been due in part to the chemical composition of the films, i.e., the presence of impurities incorporated into the silicon-nitride layers. Elements such as hydrogen, carbon and oxygen are believed to be the principal impurities responsible for film properties that do not meet theoretical predictions. It is also believed that the unintentional presence of nitrogen at the interface with a crystalline silicon surface, "below" the silicon nitride layer itself, contributes to the worse than expected electrical performance. This nitrogen within the underlying bulk semiconductor is thought to be present as a by-product of the silicon nitride deposition process.

While silicon nitride layers formed by conventional CVD have been disappointing in the areas discussed above, preferred silicon nitride layers formed as discussed above have exceptional within-wafer and wafer-to-wafer thickness, elemental concentration uniformity and low contaminating element concentrations. Moreover, these preferred silicon nitride layers have fewer impurities than conventionally formed silicon nitride layers and exhibit electrical properties more consistent with theoretical predictions. Moreover, by depositing the first silicon layer over a substrate to a thickness equal to or greater than the nitridation saturation depth, the presence of nitrogen below the silicon nitride layer is minimized. As the first layer is already greater than or equal to a nitridation saturation depth, subsequent silicon layers can advantageously be deposited to a thickness less than a thickness equal to the nitridation saturation depth. Thus, in addition to being more uniform and conformal than silicon-containing compound layers formed by conventional CVD processes, silicon-containing compound films formed in accordance with the preferred embodiments can also exhibit superior dielectric or electrical properties.

Additionally, it will be appreciated that silicon nitride layers can be formed over a silicon oxide or silicon oxynitride layer, further improving the electrical properties of the integrated silicon nitride film. The silicon oxide and silicon oxynitride layers can thus be used as an interfacial layer. These layers can be formed as discussed above, or by methods known in the art.

In addition, the silicon nitride layers formed according to the methods of the present invention also show improved oxidation resistance. The improved oxidation resistance makes the films less sensitive to clean room air exposure or to oxygen or moisture present in the reaction chamber (due to, e.g., leaks or gas purity problems) during subsequent, steps such as annealing after layer formation. Advantageously, such an anneal can be performed under oxidizing or with inert ambient conditions.

EXAMPLE 1

A silicon nitride layer was formed in a batch A412™ reactor from ASM International N.V. of Bilthoven, The Netherlands. A batch of wafers was loaded into a boat and the boat loaded into the reaction chamber and prepared for trisilane deposition. The temperature of the wafers is allowed to stabilize such that the temperature across each wafer is uniform at about 435° C. The boat was rotated about a vertical axis within the reaction chamber at the rate of 5 rpm. The pressure was set to about 1.3 Torr. Trisilane diluted with inert gas was flowed into the reaction chamber with a trisilane partial pressure of 3.3 mTorr for 1.5 minutes. A thin layer of amorphous silicon results. Trisilane flow was interrupted. Nitridation was then performed by providing 5 slm $N_2$ through an MKS remote microwave radical generator (MRG) for 10 minutes, with power set to 3000 W. The cycle was repeated about 50 times.

EXAMPLE 2

A silicon nitride layer was formed using the process of Example 1, except that during nitridation, in addition to 5 slm $N_2$ through the microwave radical generator (MRG), $NH_3$ was additionally provided separately to the reaction chamber.

The deposited films were analyzed and the results shown in FIG. 10, and discussed above, were obtained.

EXAMPLE 3

A silicon nitride layer was formed in a batch A412™ reactor from. ASM International N.V. of Bilthoven, The Netherlands. A batch of wafers was loaded into a boat, vertically separated and with major surfaces horizontally oriented, and the boat was loaded into the reaction chamber and prepared for trisilane deposition. The temperature of the wafers was allowed to stabilize such that the temperature across each wafer was uniform at about 435° C. The boat was rotated about a vertical axis within the reaction chamber at a rate of 5 rpm. The process conditions were as specified in Table 1. Four different nitridation conditions were investigated: 1—no nitridation; 2—nitridation with $N_2$; 3—nitridation with $N_2$+90 sccm $NH_3$; 4-nitridation with $N_2$+180 sccm $NH_3$. In all cases, an amorphous silicon film was deposited using 50 cycles of trisilane exposure steps, each trisilane exposure step alternated with a purge step. During the amorphous silicon deposition step, trisilane and $N_2$ were injected through a first multiple hole injector. During the nitridation step, $N_2$ (and $NH_3$) was (were) injected through a second multiple hole injector in proximity of an in-situ radical generator having a pair of electrodes extending over the vertical height of the furnace and driven by high frequency electrical power at a frequency of 2.45 GHz. For the plasma ignition, higher flows and a higher pressure were selected to facilitate the ignition of the plasma. During the subsequent plasma exposure step, lower flows and a lower pressure were used to increase the diffusion length of the radicals so that they could more easily penetrate between the vertically stacked wafers.

Figure 11:
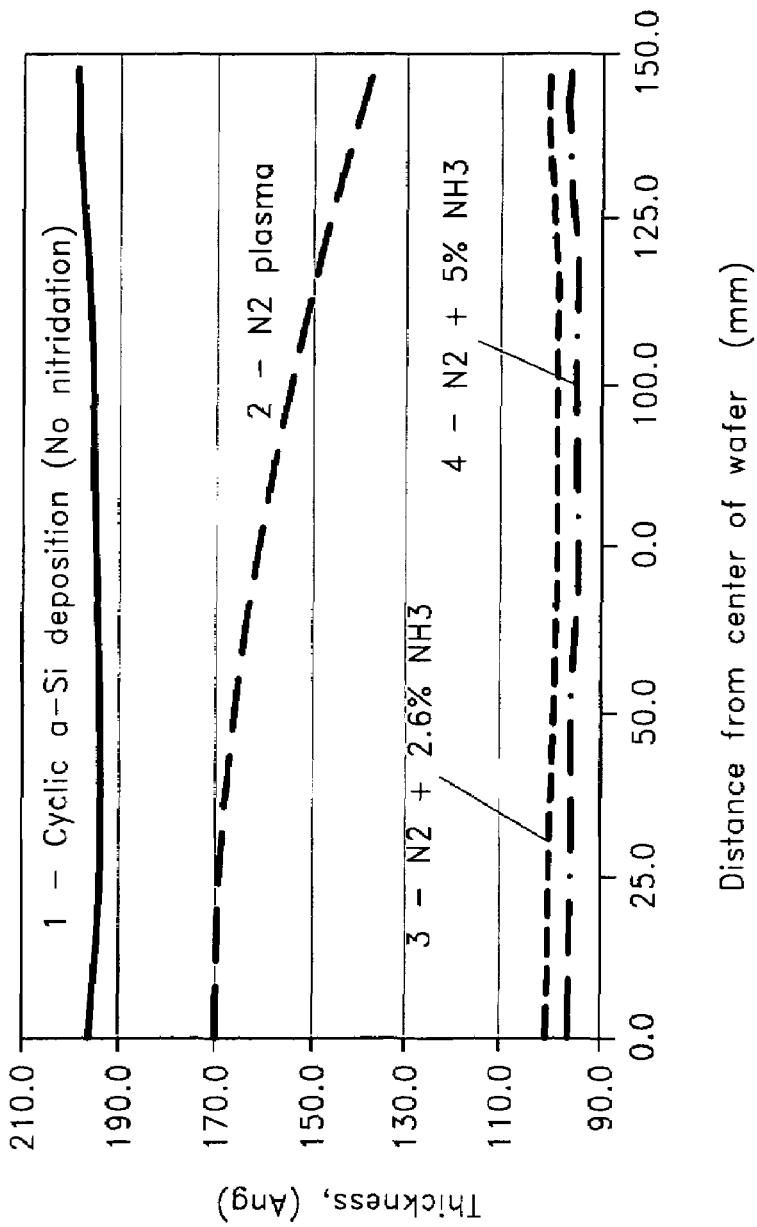
FIG. 11 is a graph illustrating the thickness for silicon layers deposited in a batch reactor using four different nitridation conditions, in accordance with some preferred embodiments of the present invention.

The addition of $NH_3$ to the $N_2$ flow had a beneficial effect on the film uniformity of the nitride films, as shown in FIG. 11. The variation in average film thickness was advantageously low at about 1.5 Å. In comparison, the variation for the silicon nitride film nitrided using $N_2$ alone was about 13 Å, and the variation for an amorphous silicon film deposited without nitridation was about 5 Å.

The addition of $NH_3$ also resulted in an average nitride film thickness that was lower than for nitridation with activated $N_2$ alone flow. The average thickness decreased with the addition of higher levels of $NH_3$. The lower nitride film thickness may indicate a more complete nitridation of the film, or a longer inhibition time for the silicon deposition after each nitridation step or may indicate a combination of both.

TABLE 1

| | Process: | | | |
|---|---|---|---|---|
| | 1 | 2 | 3 | 4 |
| Amorphous silicon deposition | | | | |
| Trisilane flow during deposition | 20 sccm | 20 sccm | 20 sccm | 20 sccm |
| $N_2$ flow during deposition | 1.0 slm | 1.0 slm | 1.0 slm | 1.0 slm |
| Tube pressure during trisilane deposition | 200 mT | 200 mT | 200 mT | 200 mT |
| Deposition time/cycle | 0:05:00 | 0:05:00 | 0:05:00 | 0:05:00 |
| Nitridation conditions | | | | |
| In-situ radical generator power | n/a | 4000 W | 4000 W | 4000 W |
| $N_2$ flow at Plasma ignition | n/a | 5.0 slm | 5.0 slm | 5.0 slm |
| $NH_3$ flow at Plasma ignition | n/a | 0 slm | 0.13 slm | 0.25 slm |
| Tube pressure at Plasma ignition | n/a | 1000 mT | 1000 mT | 1000 mT |
| Plasma ignition step time | n/a | 0:00:21 | 0:00:21 | 0:00:21 |
| $N_2$ flow during stable plasma | n/a | 3.5 slm | 3.5 slm | 3.5 slm |
| $NH_3$ flow during stable plasma | n/a | 0 slm | 0.090 slm | 0.18 slm |
| Tube pressure during stable plasma | n/a | 700 mT | 700 mT | 700 mT |
| Stable Plasma step time | n/a | 0:01:45 | 0:01:45 | 0:01:45 |
| # cycles | 50 (dep only, no plasma) | 50 (both dep and plasma) | 50 (both dep and plasma) | 50 (both dep and plasma) |

It will be appreciated that other additions to $N_2$ during the plasma nitridation step may have a similar beneficial effect. For example, Ar, $H_2$, He, or mixtures thereof can be added to the $N_2$ flow, whether or not in combination with $NH_3$. Without being limited by theory, the beneficial effect may be caused by an improved uniformity of the plasma, an improved efficiency of the plasma, the creation of more reactive radical species, or the creation of radical species having a longer lifetime or a combination of these effects.

Accordingly, it will be appreciated by those skilled in the art that various omissions, additions and modifications can be made to the processes described above without departing from the scope of the invention, and all such modifications and changes are intended to fall within the scope of the invention, as defined by the appended claims.

We claim:

1. A method of fabricating integrated circuits, comprising:
    depositing by chemical vapor deposition a silicon layer of a thickness of more than one monolayer on a plurality of substrates in a hot wall batch process chamber by exposing the substrates to a supply of trisilane;
    interrupting the supply of trisilane;
    forming a silicon compound layer by exposing the silicon layer to a reactive species after interrupting the supply, wherein the silicon compound layer has a thickness non-uniformity of about 5% or less and a step coverage of about 80% or greater; and
    further comprising repeating depositing, interrupted and forming in a plurality of cycles.

2. The method of claim 1, wherein depositing the silicon layer comprises maintaining process conditions selected to achieve reaction rate limited deposition.

3. The method of claim 2, wherein depositing the silicon layer is performed at a temperature of about 600° C. or less.

4. The method of claim 3, wherein the temperature is about 500° C. or less.

5. The method of claim 4, wherein the temperature is about 400-450° C.

6. The method of claim 2, wherein exposing the substrates to the supply of trisilane comprises establishing a trisilane partial pressure of about 10 mTorr or less.

7. The method of claim 6, wherein the trisilane partial pressure is about 3-4 mTorr.

8. The method of claim 2, wherein exposing the substrates to the supply of trisilane comprises exposing the substrates to trisilane for about 30-120 seconds.

9. The method of claim 1, wherein forming the silicon compound layer comprises exposing the silicon layer to plasma-activated reactive species.

10. The method of claim 9, wherein forming the silicon compound layer comprises activating the reactive species in a remote microwave radical generator.

11. The method of claim 9, wherein forming the silicon compound layer comprises activating the reactive species within the batch process chamber.

12. The method of claim 11, wherein activating the reactive species within the batch process chamber comprises supplying current to a conductor coil within the batch process chamber.

13. The method of claim 12, wherein the conductor coil is housed within an evacuated insulating sleeve and reactive species are formed outside the insulating sleeve and within the batch process chamber.

14. The method of claim 9, wherein the plasma-activated reactive species comprises nitrogen radicals.

15. The method of claim 9, further comprising supplying ammonia into the process chamber.

16. The method of claim 15, wherein supplying ammonia comprises first intermixing the ammonia with the plasma-activated reactive species in the process chamber.

17. The method of claim 16, wherein intermixing the ammonia with the plasma-activated reactive species activates the ammonia to form nitrogen radicals from the ammonia.

18. The method of claim 1, wherein depositing the silicon layer comprises forming the silicon layer to a thickness equal to or greater than the nitridation saturation depth.

19. The method of claim 1, wherein the reactive species comprises a nitrogen species and the silicon-containing compound layer comprises silicon nitride.

20. The method of claim 19, wherein the silicon nitride layer is more uniform than a silicon nitride layer of substantially similar thickness deposited by chemical vapor deposition with silane.

21. A method of semiconductor processing, comprising:
establishing reaction rate limited chemical vapor deposition conditions in a hot wall batch reactor chamber;
depositing a silicon layer on each of a plurality of substrates in the chamber by exposing the substrates to a silicon source, wherein the silicon layer has a thickness between about 3 Å and about 30 Å, wherein the silicon source is trisilane;
interrupting flow of the silicon source and removing the silicon source from the batch reactor chamber; and
exposing the silicon layer to radicals to form a silicon compound layer having a thickness non-uniformity of about 5% or less and a step coverage of about 80% or greater,
wherein depositing the silicon layer is performed a plurality of times to deposit a plurality of silicon layers over each of the substrates, wherein trisilane is the silicon source used to deposit a first of the silicon layers.

22. The method of claim 21, wherein the radicals comprise nitrogen and the silicon compound is silicon nitride.

23. The method of claim 21, wherein exposing the silicon layer to radicals comprises exposing the silicon layer to ammonia and plasma-activated radicals.

24. The method of claim 23, wherein the plasma-activated radicals are nitrogen radicals.

25. The method of claim 23, wherein the plasma-activated radicals are one or more species chose from the group consisting of argon, hydrogen and helium radicals.

26. The method of claim 23, wherein exposing the silicon layer to radicals comprises generating the plasma-activated radicals in situ.

27. The method of claim 21, wherein exposing the silicon layer to radicals comprises remotely generating the plasma-activated radicals and supplying the plasma activated-radicals to the reactor chamber.

28. The method of claim 21, wherein exposing the silicon layer to radicals comprises exposing the silicon layer to plasma-activated nitrogen radicals and to one or more species chose from the group consisting of argon, hydrogen and helium radicals.

29. The method of claim 21, wherein depositing, interrupting and exposing comprises continuously flowing $N_2$ into the batch reactor chamber, wherein exposing comprises providing power to a radical generator to generate radicals.

30. The method of claim 29, wherein depositing, interrupting and exposing comprises continuously flowing $NH_3$ into the batch reactor chamber.

31. The method of claim 22, wherein the layer of an insulating silicon compound has a stoichiometry of about 45 silicon atoms per 56 nitrogen atoms.

32. The method of claim 21, wherein the radicals comprise oxygen and wherein the silicon compound is silicon oxide.

33. The method of claim 21, wherein the silicon source for depositing subsequent silicon layers after depositing the first silicon layer comprises one or more silicon precursors selected from the group consisting of silanes having a silane chemical formula $Si_nH_{2n+2}$, where n=1 to 4, and halosilanes having a halosilane chemical formula $R_{4-X}SiH_X$, where R=Cl, Br or I and X=0 to 3.

34. The method of claim 33, wherein a first substrate temperature for depositing the first silicon layer is less than about 500° C.

35. The method of claim 21, wherein depositing, interrupting and exposing are performed at a temperature of less than about 600° C.

36. The method of claim 21, wherein depositing the silicon layer comprises providing trisilane through a gas injector.

37. The method of claim 36, wherein the gas injector has a plurality of openings along a height of the batch reactor chamber.

38. The method of claim 21, wherein removing the silicon source comprises purging the process chamber with inert gas.

39. The method of claim 21, wherein removing the silicon source comprises performing one or more removal processes selected from the group consisting of evacuation of the silicon source, or displacement of the silicon source gas by a gas carrying radicals.

40. The method of claim 21, further comprising removing the radicals and exposing the substrates an other reactive species.

41. The method of claim 40, wherein the other reactive species is a dopant.

42. The method of claim 21, wherein exposing the silicon layer to radicals forms a gate dielectric layer.

43. The method of claim 42, further comprising forming a gate electrode over the gate dielectric layer.

44. The method of claim 21, wherein the reaction chamber is configured to accommodate a wafer boat, the wafer boat configured to accommodate the plurality of substrates.

* * * * *

UNITED STATES PATENT AND TRADEMARK OFFICE
CERTIFICATE OF CORRECTION

PATENT NO. : 7,294,582 B2
APPLICATION NO. : 11/213449
DATED : November 13, 2007
INVENTOR(S) : Haverkort et al.

It is certified that error appears in the above-identified patent and that said Letters Patent is hereby corrected as shown below:

Title Page 2; Column 2 (Other Publications); Line 10; Delete "(1983)." and insert -- (1993). --, therefor.

Column 20; Line 28 (Approx.); Delete "from." and insert -- from --, therefor.

Column 24; Line 35; In Claim 39, delete "or" and insert -- and --, therefor.

Signed and Sealed this

Twentieth Day of May, 2008

JON W. DUDAS
*Director of the United States Patent and Trademark Office*